US007945895B2

(12) United States Patent
Breyer

(10) Patent No.: US 7,945,895 B2
(45) Date of Patent: *May 17, 2011

(54) GRAPHICAL PROGRAMS WITH FIFO STRUCTURE FOR CONTROLLER/FPGA COMMUNICATIONS

(75) Inventor: John R. Breyer, Austin, TX (US)

(73) Assignee: National Instruments Corporation, Austin, TX (US)

( * ) Notice: Subject to any disclaimer, the term of this patent is extended or adjusted under 35 U.S.C. 154(b) by 1385 days.

This patent is subject to a terminal disclaimer.

(21) Appl. No.: 11/421,691

(22) Filed: Jun. 1, 2006

(65) Prior Publication Data

US 2007/0089063 A1 Apr. 19, 2007

Related U.S. Application Data

(63) Continuation-in-part of application No. 11/252,001, filed on Oct. 17, 2005, now Pat. No. 7,606,950.

(51) Int. Cl.
*G06F 9/45* (2006.01)
(52) U.S. Cl. ...................................................... 717/113
(58) Field of Classification Search .................... 717/113
See application file for complete search history.

(56) References Cited

U.S. PATENT DOCUMENTS

| 4,914,568 A | 4/1990 | Kodosky et al. |
| 5,481,741 A | 1/1996 | McKaskle et al. |
| 6,173,438 B1 | 1/2001 | Kodosky et al. |
| 6,784,903 B2 * | 8/2004 | Kodosky et al. ............... 715/771 |
| 7,024,660 B2 | 4/2006 | Andrade |
| 7,028,222 B2 | 4/2006 | Peterson et al. |
| 6,219,628 B1 | 7/2006 | Kodosky |
| 6,763,515 B1 | 7/2006 | Vazquez |

(Continued)

FOREIGN PATENT DOCUMENTS

EP 1 004 085 B1 8/2003

OTHER PUBLICATIONS

International search report and written opinion for application No. PCT/US2006/041012 mailed Jun. 6, 2007.

(Continued)

*Primary Examiner* — John Chavis
(74) *Attorney, Agent, or Firm* — Meyertons Hood Kivlin Kowert & Goetzel, P.C.; Jeffrey C. Hood; Mark S. Williams

(57) ABSTRACT

System and method for communicating between graphical programs executing on respective devices, e.g., a programmable hardware element (PHE) and a controller. The system includes a first node representing a first in, first out (FIFO) structure, and a second node providing a controller interface to the FIFO structure. A first portion of the FIFO is implemented on the PHE, and a second portion of the FIFO is implemented in memory of the controller. The first and second nodes are operable to be included respectively in first and second graphical programs, where the first graphical program is deployable to the PHE, where the second graphical program is deployable to the controller, and where the graphical programs communicate via the FIFO in cooperatively performing a specified task. The FIFO may implement a Direct Memory Access (DMA) FIFO, where at least part of a DMA controller is implemented on or coupled to the PHE.

43 Claims, 13 Drawing Sheets

U.S. PATENT DOCUMENTS

| | | | |
|---|---|---|---|
| 7,085,670 B2 * | 8/2006 | Odom et al. | 702/127 |
| 7,530,052 B2 * | 5/2009 | Morrow et al. | 717/113 |
| 7,565,609 B2 * | 7/2009 | Vrancic et al. | 715/734 |
| 2001/0020291 A1 | 9/2001 | Kudukoli et al. | |
| 2003/0034998 A1 | 2/2003 | Kodosky et al. | |
| 2003/0040881 A1 * | 2/2003 | Steger et al. | 702/123 |
| 2003/0192032 A1 * | 10/2003 | Andrade et al. | 717/124 |
| 2004/0015924 A1 * | 1/2004 | Shah et al. | 717/154 |
| 2005/0257194 A1 | 11/2005 | Morrow | |
| 2005/0257195 A1 * | 11/2005 | Morrow et al. | 717/109 |
| 2006/0015862 A1 | 1/2006 | Odom | |
| 2006/0041859 A1 | 2/2006 | Vrancic | |
| 2006/0053211 A1 | 3/2006 | Kornerup | |
| 2007/0044072 A1 * | 2/2007 | Hayles | 717/113 |
| 2007/0088865 A1 * | 4/2007 | Breyer | 710/22 |

OTHER PUBLICATIONS

Steven S. Lumetta and David E. Culler; "Managing Concurrent Access for Shared Memory Active Messages"; IEEE Proceedings of the International Parallel Processing Symposium; Apr. 1998; pp. 272-278.

Michel Dubois and Christoph Scheurich; "Memory Access Dependencies in Shared-Memory Multiprocessors"; IEEE Transactions on Software Engineering; Jun. 1990; pp. 660-673; vol. 16, No. 6.

Narain H. Gehani; "Capsules: A Shared Memroy Access Mechanism for Concurrent C/C++"; IEEE Transactions on Parallel and Distributed Systems; Jul. 1993; pp. 795-811; vol. 4, No. 7.

"LabVIEW Real-Time Module User Manual", Apr. 2004 Edition; 72 pages; National Instruments Corporation.

* cited by examiner

GRAPHICAL PROGRAMS WITH FIFO STRUCTURE FOR CONTROLLER/FPGA COMMUNICATIONS

CONTINUATION AND PRIORITY DATA

This application is a Continuation-In-Part of, and claims benefit of priority to, U.S. patent application Ser. No. 11/252,001, titled "Graphical Programs With Direct Memory Access FIFO For Controller/FPGA Communications", filed Oct. 17, 2005, now U.S. Pat. No. 7,606,950 whose inventor is John R. Breyer, and which is incorporated by reference in its entirety as though fully and completely set forth herein.

FIELD OF THE INVENTION

The present invention relates to the field of graphical programming, and more particularly to a system and method for enabling a graphical program executing on a controller to communicate with a graphical program executing on a programmable hardware element, e.g., a field programmable gate array (FPGA).

DESCRIPTION OF THE RELATED ART

Traditionally, high level text-based programming languages have been used by programmers in writing application programs. Many different high level text-based programming languages exist, including BASIC, C, C++, Java, FORTRAN, Pascal, COBOL, ADA, APL, etc. Programs written in these high level text-based languages are translated to the machine language level by translators known as compilers or interpreters. The high level text-based programming languages in this level, as well as the assembly language level, are referred to herein as text-based programming environments.

Increasingly, computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptualize a problem or process and then to program a computer to implement a solution to the problem or process. Since a user often is not fully proficient in techniques for programming a computer system in a text-based environment to implement his solution, the efficiency with which the computer system can be utilized often is reduced.

To overcome the above shortcomings, various graphical programming environments now exist which allow a user to construct a graphical program or graphical diagram, also referred to as a block diagram. U.S. Pat. Nos. 4,901,221; 4,914,568; 5,291,587; 5,301,301; and 5,301,336; among others, to Kodosky et al disclose a graphical programming environment which enables a user to easily and intuitively create a graphical program. Graphical programming environments such as that disclosed in Kodosky et al can be considered a higher and more intuitive way in which to interact with a computer. A graphically based programming environment can be represented at a level above text-based high level programming languages such as C, Basic, Java, etc.

A user may assemble a graphical program by selecting various icons or nodes which represent desired functionality, and then connecting the nodes together to create the program. The nodes or icons may be connected by lines representing data flow between the nodes, control flow, or execution flow. Thus the block diagram may include a plurality of interconnected icons such that the diagram created graphically displays a procedure or method for accomplishing a certain result, such as manipulating one or more input variables and/or producing one or more output variables. In response to the user constructing a diagram or graphical program using the block diagram editor, data structures and/or program instructions may be automatically constructed which characterize an execution procedure that corresponds to the displayed procedure. The graphical program may be compiled or interpreted by a computer.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and output that will be used by the graphical program, and may include other icons which represent devices being controlled.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

In parallel with the development of the graphical programming model, programmable hardware elements have increasingly been included in devices, such as simulation, measurement, and control devices, where the programmable hardware element is configurable to perform a function, such as simulation or modeling of a device, a measurement and/or control function, modeling or simulation function, or any other type of function. Typically, a software program, e.g., a text based program or a graphical program, such as may be developed in National Instruments Corporation's LabVIEW graphical development environment, is developed either manually or programmatically, and converted into a hardware configuration program, e.g., a netlist or bit file, which is then deployed onto the programmable hardware element, thereby configuring the programmable hardware element to perform the function. For example, the programmable hardware element may be a field programmable gate array (FPGA). Similarly, the program may be an FPGA VI, operable to be deployed to the FPGA.

In many applications, a task, such as a measurement task, may be performed conjunctively by programs executing respectively on a computer system and a programmable hardware element coupled to the computer system, and thus may require communication between the programs during performance of the task. For example, LabVIEW FPGA is an add-on module for the LabVIEW development environment that allows LabVIEW users to run graphical programs on FPGA hardware. The FPGAs that LabVIEW can run on are computing nodes that are distinct from other computing nodes in the system, such as Windows or LabVIEW RT (LabVIEW "Real Time") nodes. One specific example of this is the NI PXI-7831R FPGA board, which is a PXI board that includes an FPGA that is targetable by LabVIEW FPGA. The PXI-7831R itself is typically installed in a PXI chassis with a controller (i.e., an embedded computer) that runs either Windows or LabVIEW RT. Therefore, there are two computing nodes in the system, the FPGA (that runs LabVIEW FPGA), and the controller (that runs LabVIEW or LabVIEW RT). These two nodes are distinct, and yet may need to work together and communicate with each other.

In prior art systems, such communication has generally been performed via either interrupts or register accesses. For example, interrupts may be used to allow an FPGA node to send an event to the controller node, which may then respond to the event and perform an action. Interrupts have the drawback of not being able to send data with the interrupt. Register access are often used to send data to and from the FPGA device. However, register accesses have the drawback of being slow, especially in the case of very large amounts of data. For example, if 1,000,000 samples are to be transferred between the FPGA and the controller, 1,000,000 individual register accesses must typically be performed.

Thus, improved systems and methods are desired for communicating between programs executing respectively on a computer system and a programmable hardware element.

SUMMARY OF THE INVENTION

One embodiment of the present invention comprises a system and method for communicating between programs executing respectively on a controller and a programmable hardware element (or alternatively, on respective programmable hardware elements).

A first node representing a first in, first out data structure (FIFO) may be included in a first graphical program in response to user input. In other words, the first node may comprise a graphical representation of the FIFO. The first graphical program may comprise a first plurality of interconnected nodes that visually indicate functionality of the first graphical program. The first graphical program is intended for deployment and execution on a programmable hardware element, e.g., such as on reconfigurable device. The reconfigurable device may be coupled via a bus to a computer system (controller). Note that the bus may be any type of transmission medium desired, including for example a transmission cable, a local area network (LAN), a wide area network (WAN), e.g., the Internet, etc., including wired or wireless transmission means, as desired. For example, in preferred embodiments, at least a first portion of the FIFO is operable to be implemented on a programmable hardware element. For example, at least a first portion of the FIFO data storage elements may be operable to be implemented on a programmable hardware element, e.g., an FPGA, of the reconfigurable device.

In one embodiment, the FIFO may be implemented as a DMA FIFO, although it should be noted that this is but one of numerous ways to implement the FIFO. In this embodiment, the reconfigurable device may also include (e.g., be configured to include) a DMA controller, described in more detail below. As described further below, in other embodiments various data transfer logic may be implemented on the FIFO to facilitate use of the FIFO by the first and second graphical programs. Alternatively, or in addition, a portion or all of the FIFO interface may be implemented in software.

In some embodiments, other techniques of data transfer may be used to interface to the FIFO. For example, in some embodiments, the reconfigurable device may not include data transfer logic, e.g., DMA logic, coupled to or included in the programmable hardware element, and such logic may not be used to transfer the data. There are two other common methods of doing device I/O other than DMA, known as programmed I/O and interrupt-driven I/O. Programmed I/O is completely under the control of the host processor (CPU) and the program that is running on it. The processor (CPU) may move data to and from the device by performing reads and writes to the device, e.g., via messages and/or registers. The processor may retrieve status information from the device (such as whether the data are ready) by also performing reads to the device, where reads and writes to the device may occur one after the other. Note that is a relatively slow method of moving data. For example, in waiting for a block of data on the device, the device may have to be continuously polled to check the status until the data are ready, and then move the data point by point by reading the device to put the data in host memory.

Interrupt-driven I/O is similar to programmed I/O in that the processor or CPU still moves data to and from the device by reading and writing to the device. However, in this approach status information may be received from the device by having the device send interrupts to the processor. This can be much more efficient than programmed I/O. Using the same example as for programmed I/O, in waiting for a block of data on the device, to check the status the device does not have to be continuously polled until the data are ready, rather, a process would simply register to receive an interrupt from the device and put the process thread to sleep until the interrupt was received, with no polling required. Data is still moved point by point by the processor by reading the device to put the data into host memory.

Thus, in some embodiments, the programmable hardware element may not be configured to control the data transfers. For example, in some embodiments, the data transfers may be performed via the controller's processor, e.g., the processor of the computer system, or that of a different controller. In other words, instead of using DMA to transfer data to and from the FIFO, the controller's processor executes software instructions to perform the data transfers, referred to as programmed I/O.

Note that in some embodiments, the first node, e.g., the FIFO node, may be configurable to specify some attributes of the FIFO, e.g., may be configurable to specify one or more of: depth of the FIFO structure (described in more detail below), direction of the FIFO structure, i.e., controller memory to programmable hardware element, or programmable hardware element to controller memory, and the data type of the FIFO structure, among others. The FIFO structure node may also be operable to provide status information for the FIFO structure, such as whether the FIFO (or the portion implemented on the programmable hardware element) is full, and so forth.

A second node may be included in a second graphical program in response to second user input, where the second node is operable to provide a controller interface to the FIFO structure. Like the first graphical program, the second graphical program may comprise a second plurality of interconnected nodes that visually indicate functionality of the second graphical program. The second graphical program is intended for deployment and execution on a controller, such as the computer system (or another computer system) or another controller. The second graphical program (i.e., block diagram) may include a loop structure or other graphical program construct(s) as desired, and the second node, which may be referred to as a FIFO manager node, may be contained therein.

In some embodiments, a second portion of the FIFO structure is operable to be implemented in memory of the controller, e.g., the computer system. For example, a second portion of the FIFO, e.g., a second portion of the FIFO's data storage elements, may be operable to be implemented in the memory of the controller (or computer system or another computer system). Thus, the FIFO structure may be comprised on both the programmable hardware element and the controller, and thus may comprise a distributed FIFO.

In some embodiments, the second node, e.g., the FIFO manager node may be configurable to specify a desired function of the FIFO structure. For example, the second node may be operable to receive input specifying FIFO read operations, FIFO write operations, FIFO start operations, FIFO stop operations, and FIFO configure operations, among other FIFO methods or functionality. For example in one embodiment, to specify a desired function of the FIFO structure, one or more selectable options for specifying the desired function of the FIFO structure may be provided, and input, e.g. user input, may be received selecting one of the one or more selectable options to specify the desired function of the FIFO structure, after which, the second node may be executable to invoke or perform the desired function of the FIFO structure.

In various embodiments, the selectable options may be provided by program code, e.g., program instructions, stored in the memory of the computer system, e.g., comprised in the development environment in which the graphical program is being written and/or by the second node or program code associated with the second node. For example, in preferred embodiments, e.g., where the second node functions as a user interface node (i.e., is capable of displaying information and/or receiving input), the node may include both edit time and runtime program code, where the edit time code implements functionality that may operate at edit time, and where the runtime code operates at runtime, the edit time code of the node may execute to provide the options. In preferred embodiments, such edit time code of the second node may operate in conjunction with other program code, e.g., program code comprised in the development environment, e.g., the graphical program editor, to manage the presentation and selection of the options.

In some embodiments, various attributes or fields of the FIFO structure may be displayed by the node, e.g., "FIFO Read", "Number of Elements", "Timeout", "Data", and "Elements Remaining", although other fields or attributes may be used as desired. Note that provision of the selectable options may be invoked in any of a variety of ways. For example, in one embodiment, the user may click (e.g., left-click, right-click, double click, etc., of a mouse or other pointing device) on the node to invoke display of the options, e.g. in a drop-down display of the node. The user may then select one of the options to specify the desired functionality of the FIFO structure, e.g., by clicking on the desired option. Of course, any other means for providing, displaying, and/or selecting the selectable options are also contemplated, the above being but an exemplary manner of doing so.

Once the selection has been made, i.e., once the node/FIFO structure has been configured to provide the desired functionality, the second node may represent the specified functionality of the FIFO structure in the second graphical program. For example, if FIFO read functionality were selected, the second node may then function as a FIFO read node in the second graphical program. In one embodiment, the appearance of the second node may be automatically modified to reflect or indicate the specified functionality, e.g., the node's icon, color, shape, or label, may be modified in accordance with the selected option.

In some embodiments, to provide the one or more selectable options for specifying the desired function of the FIFO structure, program code, e.g., comprised in the development environment and/or the second node, and/or associated with the second node, may be operable to determine the FIFO structure's configuration, and only provide or present options that are in accordance with the FIFO structure's configuration. In other words, the options provided by or for the second node may be based on the FIFO structure's configuration. For example, in one embodiment, the development environment (e.g., editor), the second node, and/or program code associated with the second node, may access and analyze configuration information included in, or associated with, the FIFO structure node, i.e., the first node, described above. Based on this configuration information, only those options that are consonant with the configuration information, i.e., with the configured capabilities of the FIFO structure, may be presented.

In some embodiments, determining the FIFO structure's configuration may include accessing edit time source code of the first node, and/or a compiled bit file generated from the source code of the first node. For example, in one embodiment, the editor (of the development environment) may access the first graphical program source code, e.g., via a project that includes the source code for both the first and second graphical programs. As another example, the editor (or node or associated code) may access the compiled bit file generated from the source code of the first node, and thus this access may be performed after compilation.

In some embodiments, at least one of the one or more selectable options may specify a first function that requires one or more corollary functions. For example, in one embodiment, FIFO read functionality may always require prior performance of a FIFO start function, for example, or a validate state function; thus, a selected option specifying FIFO read operations may automatically specify inclusion of the FIFO start or validate functionality in the graphical program, along with the FIFO read functionality, this being but one simple example. In preferred embodiments, this automatic inclusion of corollary functionality based upon selected FIFO function options is transparent to the user. For example, in some embodiments, the graphical program may not contain any visible graphical program elements specifically indicating or representing the corollary functionality. Thus, if the second node is configured to invoke the first function, the second node may be executable to automatically invoke the one or more corollary functions in addition to the first function. Alternatively, in other embodiments, in response to the selection of the option, the one or more additional graphical program elements, e.g., nodes, indicating or representing the corollary functionality associated with the selected option may automatically be included and displayed in the graphical program.

It should be noted that the first graphical program, including the first node, is preferably deployable to the programmable hardware element, while the second graphical program, including the second node, is preferably deployable to the controller, or computer system, where the first and the second graphical program are executable to communicate via the FIFO structure to cooperatively perform a specified task.

In various embodiments, the FIFO structure may be implemented in any of a variety of ways. For example, in some embodiments, the FIFO structure may require data transfer logic for transferring data between portions of the FIFO structure. In different embodiments, the data transfer logic may be implemented in software, and/or hardware, and may be comprised in one or both of the controller and the reconfigurable device.

For example, as noted above, in one embodiment, the FIFO structure may be implemented as a Direct Memory Access (DMA) FIFO, where DMA is used to transfer data between the two portions of the FIFO. As is well known in the art of memory access and management, a DMA controller is generally used to facilitate direct access to memory in place of a processor. Thus, in embodiments of the present system where the FIFO structure is implemented as a DMA FIFO, the reconfigurable device may require a DMA controller, i.e., DMA logic, e.g., either coupled to and/or implemented on the programmable hardware element. For example, in one embodiment, the DMA controller may be included on the same circuit board as the programmable hardware element, and may be communicatively coupled thereto to facilitate direct memory access by the DMA FIFO, e.g., by the programmable hardware element, of the portion of the DMA FIFO comprised in the memory of the controller (or computer system). However, in some embodiments, the DMA controller may not inherently support or provide FIFO functionality, and so custom logic may need to be generated, as described below.

Thus, in embodiments where data transfer logic, e.g., a memory controller, is required to transfer data between portions of the FIFO, at least a portion of this data transfer logic may be automatically generated in response to including the first node in the first graphical program, and may be generated in accordance with configuration information for the FIFO. For example, in embodiments where the FIFO is a DMA FIFO, at least a portion of the DMA controller, i.e., additional DMA logic, may be automatically generated in response to including the first node in the first graphical program, and may be generated in accordance with configuration information for the DMA FIFO. The at least a portion of DMA logic may be deployable to the programmable hardware element to implement FIFO functionality for the DMA controller, e.g., to implement the DMA FIFO functionality.

The first graphical program, and optionally the at least a portion of data transfer logic, e.g., of DMA logic, may be deployed to the programmable hardware element. The second graphical program may be deployed to the controller (or computer system). Note that deploying the second graphical program to the computer system may simply mean compiling the program for execution by the processor, placing the program in a particular directory, or otherwise making sure that the second graphical program is properly executable by the computer system, since in preferred embodiments, the second graphical program is developed on the computer system, and thus may already be present.

In some embodiments where the FIFO structure is a DMA FIFO, the first DMA controller portion may be coupled to the programmable hardware element, but may not actually be implemented on the programmable hardware element. In other embodiments, the first DMA controller portion may be deployed to and comprised on the programmable hardware element. Node that in various other DMA FIFO embodiments, the DMA controller may be comprised entirely on the programmable hardware element, or, alternatively, may not be comprised on the programmable hardware element at all, i.e., may simply be coupled to the programmable hardware element.

Thus, in some embodiments, the system may include the computer system, where the computer system includes a processor and memory, the programmable hardware element, coupled to the computer system, and data transfer logic, in the form of a DMA controller comprised on and/or coupled to the programmable hardware element. In one embodiment, the DMA controller may include first DMA logic, coupled to or comprised on the programmable hardware element, where the first DMA logic implements DMA functionality, and second DMA logic, comprised on the programmable hardware element, where the second DMA logic implements FIFO functionality for the first DMA logic. Once the first and second graphical programs (and possibly some or all of the DMA controller logic) have been deployed, the DMA controller may be operable to receive instructions from the first node and the second node and directly transfer data between the programmable hardware element and the memory of the computer system in accordance with the received instructions.

Finally, the first graphical program may be executed on the programmable hardware element, and the second graphical program may be executed on the controller concurrently with the execution of the first graphical program to cooperatively perform the specified task. Note that in embodiments where the FIFO structure is implemented as a DMA FIFO, the FIFO (possibly in conjunction with the DMA controller) preferably facilitates direct memory access of the controller memory, specifically, FIFO storage elements comprised in the memory of the controller, by the first graphical program, during execution. As noted above, in other embodiments, the controller transfers the data between the controller and the reconfigurable device, and so no special data transfer logic, e.g., such as a DMA controller, is needed.

BRIEF DESCRIPTION OF THE DRAWINGS

A better understanding of the present invention can be obtained when the following detailed description of the preferred embodiment is considered in conjunction with the following drawings, in which.

Figure 1A:
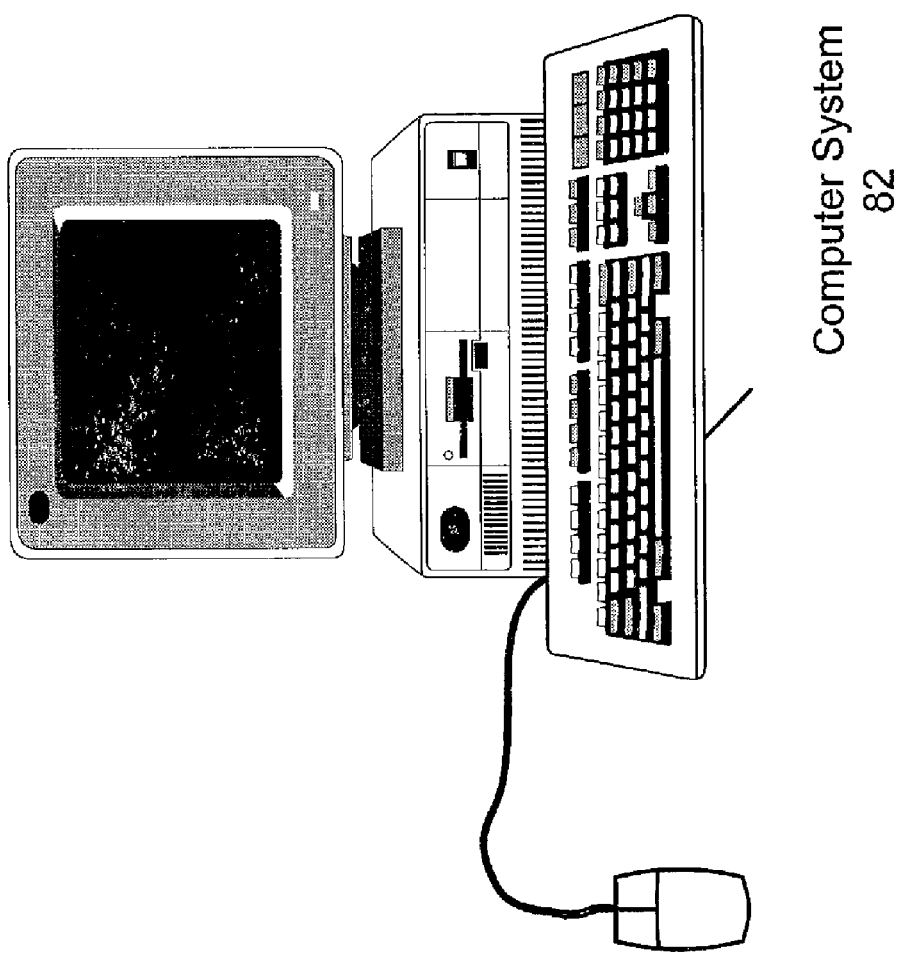
FIG. 1A illustrates a computer system that may be suitable for implementing an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment," issued on Jan. 2, 1996.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

U.S. patent application Ser. No. 08/912,427 titled "System and Method for Converting Graphical Programs Into Hardware Implementations" filed on Aug. 18, 1997, whose inventors were Jeffrey L. Kodosky, Hugo Andrade, Brian Keith Odom, and Cary Paul Butler.

U.S. patent application Ser. No. 10/177,553 titled "Target Device-Specific Syntax and Semantic Analysis For a Graphical Program" filed on Jun. 21, 2002, whose inventors were Newton G. Petersen and Darshan K. Shah.

U.S. patent application Ser. No. 11/252,001, titled "Graphical Programs With Direct Memory Access FIFO For Controller/FPGA Communications", filed Oct. 17, 2005, whose inventor is John R. Breyer.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected nodes or icons that visually indicate operation of the model or block diagram; exemplary graphical modeling environments include Simulink, SystemBuild, VisSim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Node—In the context of a graphical program, an element that may be included in a graphical program. A node may have an associated icon that represents the node in the graphical program, as well as underlying code or data that implements functionality of the node. Exemplary nodes include function nodes, terminal nodes, structure nodes, etc. Nodes may be connected together in a graphical program by connection icons or wires.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium, including, for example, a controller or embedded computer.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Controller—generally refers to a computer system as defined above, and in some embodiments specifically refers to an embedded computer. An embedded computer may be considered a computer system without its own user interface/display capability.

FIG. 1A—Computer System

FIG. 1A illustrates a computer system 82 that may be suitable for implementing various embodiments of the present invention. More specifically, the computer system 82 may be operable to store, deploy, and/or execute graphical programs according to embodiments of the invention, and may also be useable to create such graphical programs. As shown in FIG. 1A, the computer system 82 may include a display device operable to display the graphical program as the graphical program is created and/or executed. The display device may also be operable to display a graphical user interface or front panel of the graphical program during execution of the graphical program. The graphical user interface may comprise any type of graphical user interface, e.g., depending on the computing platform.

The computer system 82 may include a memory medium(s) on which one or more computer programs or software components according to one embodiment of the present invention may be stored. For example, the memory medium may store graphical programs implementing a FIFO structure for communicating between a programmable hardware element and a controller, as well as one or more graphical programs that are executable to perform embodiments of the methods described herein. Also, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a computer accessible physical storage medium.

It should be noted that the computer system 82, i.e., executing a development environment, may function as a development platform for creating the various graphical programs described herein, and may optionally also serve as a controller, executing various of the graphical programs in a cooperative manner with or more additional devices coupled to the computer, e.g., a reconfigurable device that includes a programmable hardware element. In some embodiments, graphical programs developed on the computer system 82 may be deployed to other devices for execution. For example, a first graphical program may be deployed to a controller (or other computer system) for execution by a processor, and a second graphical program may be deployed to a reconfigurable device coupled to the controller, where the device includes a programmable hardware element, e.g., an FPGA, and where the controller and the reconfigurable device execute their respective graphical programs to cooperatively perform a specified task, e.g., a measurement task.

It should be noted that while the computer system 82 may operate as a controller, in some applications, a controller may not include such standard computer peripherals as a display or a hard drive.

Figure 1B:
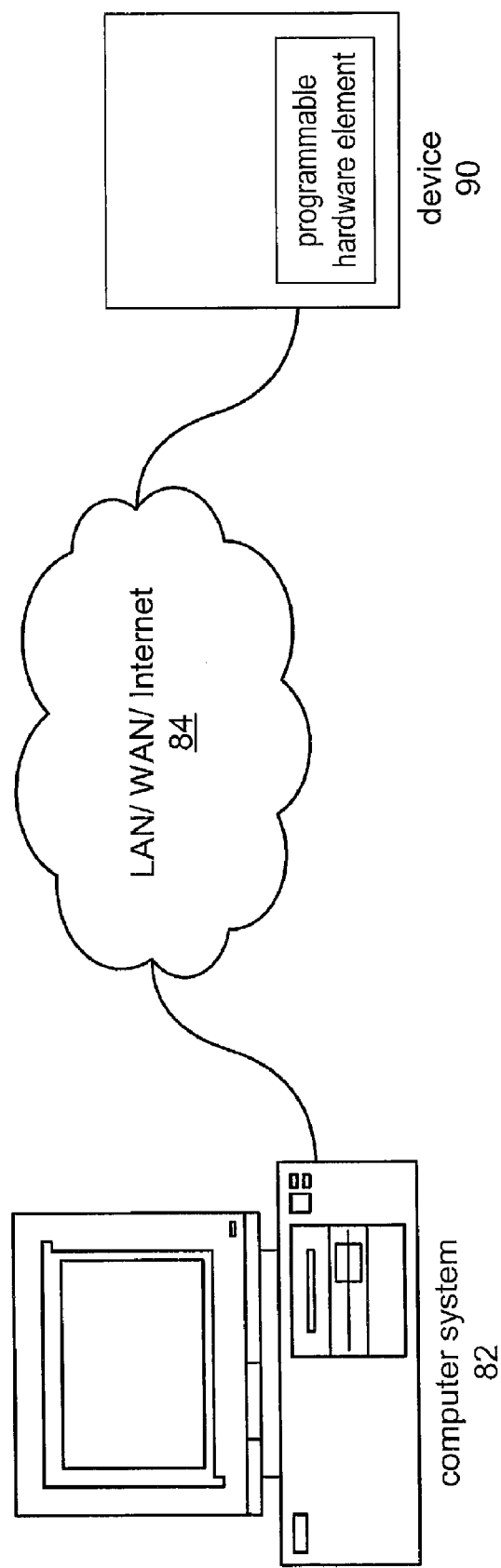
FIG. 1B illustrates a network system comprising the computer system of FIG. 1A and a device suitable for implementing some embodiments of the present invention.

FIG. 1B—Computer Network

FIG. 1B illustrates a system including a first computer system 82 that is coupled to a second system or device 90, e.g., via a network 84 (or a computer bus). The computer system 82 and the system 90 may each be any of various types, as desired. The network 84 can also be any of various types, including a LAN (local area network), WAN (wide area network), the Internet, or an Intranet, among others. The computer system 82 and the device 90 may execute one or more graphical programs in a distributed fashion. For example, computer 82 may execute a first graphical program and device 90 may execute a second graphical program, wherein the first and second graphical programs share a FIFO structure used for communication or data transfer between the first and second graphical programs.

In preferred embodiments, described below in detail, a first graphical program may be executed on the computer system 82 (and/or computer system 90) or on a controller, and a second graphical program may be deployed to and executed on a reconfigurable device, e.g., device 90, wherein the device 90 includes a programmable hardware element, e.g., an FPGA, that is coupled to the computer system or controller.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
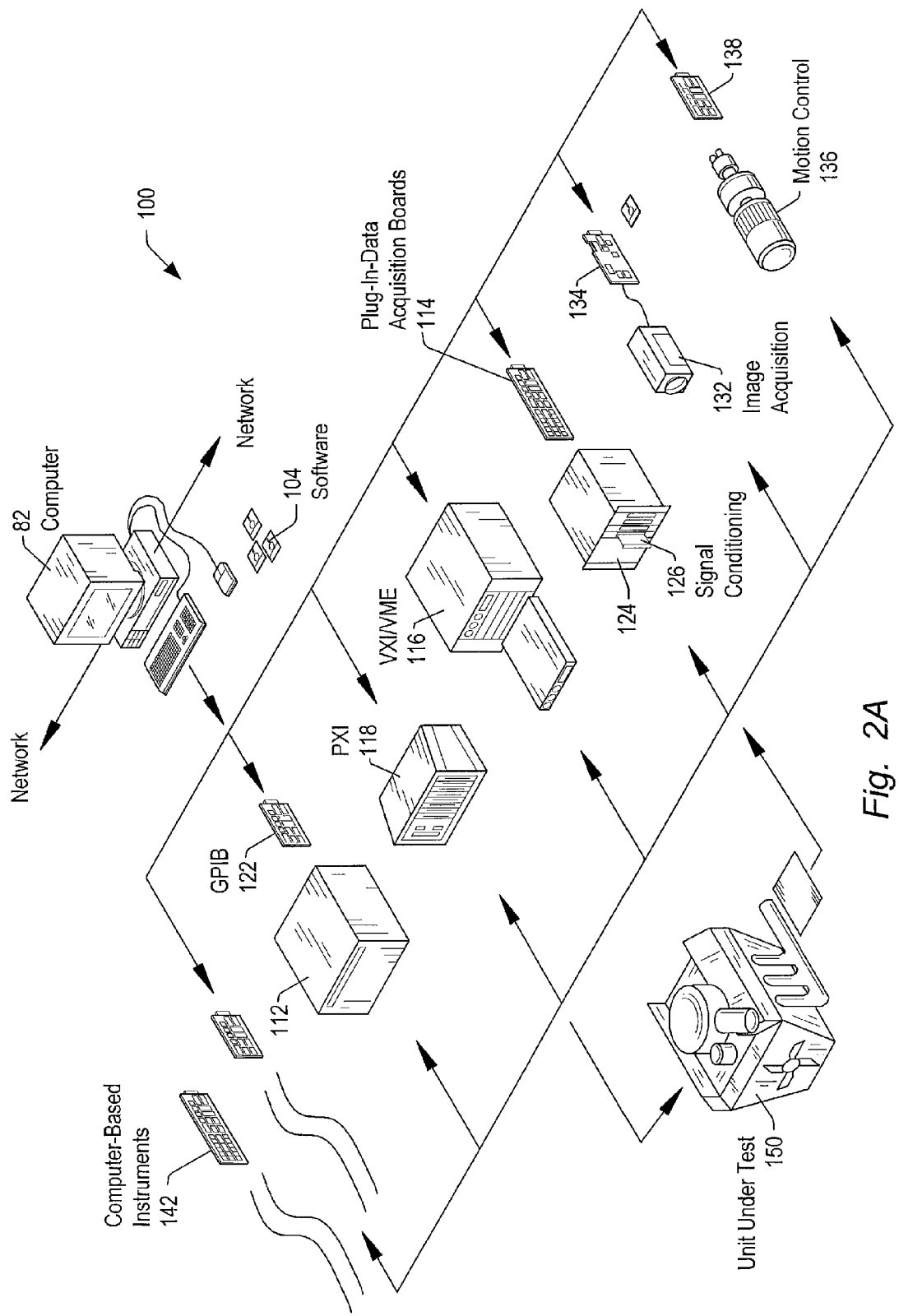
FIG. 2A illustrates an instrumentation control system according to one embodiment of the invention.

FIG. 2A illustrates an exemplary instrumentation control system 100 which may implement embodiments of the invention. The system 100 comprises a host computer 82 that connects to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150. One or more of the instruments may include a programmable hardware element which may be configured with a graphical program. As discussed below, a first graphical program executing on the computer 82 may interact with a second graphical program executing on the programmable hardware element of the instrument using a FIFO structure.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices, where, for example, at least one of the instruments includes a programmable hardware element, e.g., an FPGA, as described below in more detail. The computer system may couple to and operate with one or more of these instruments. The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
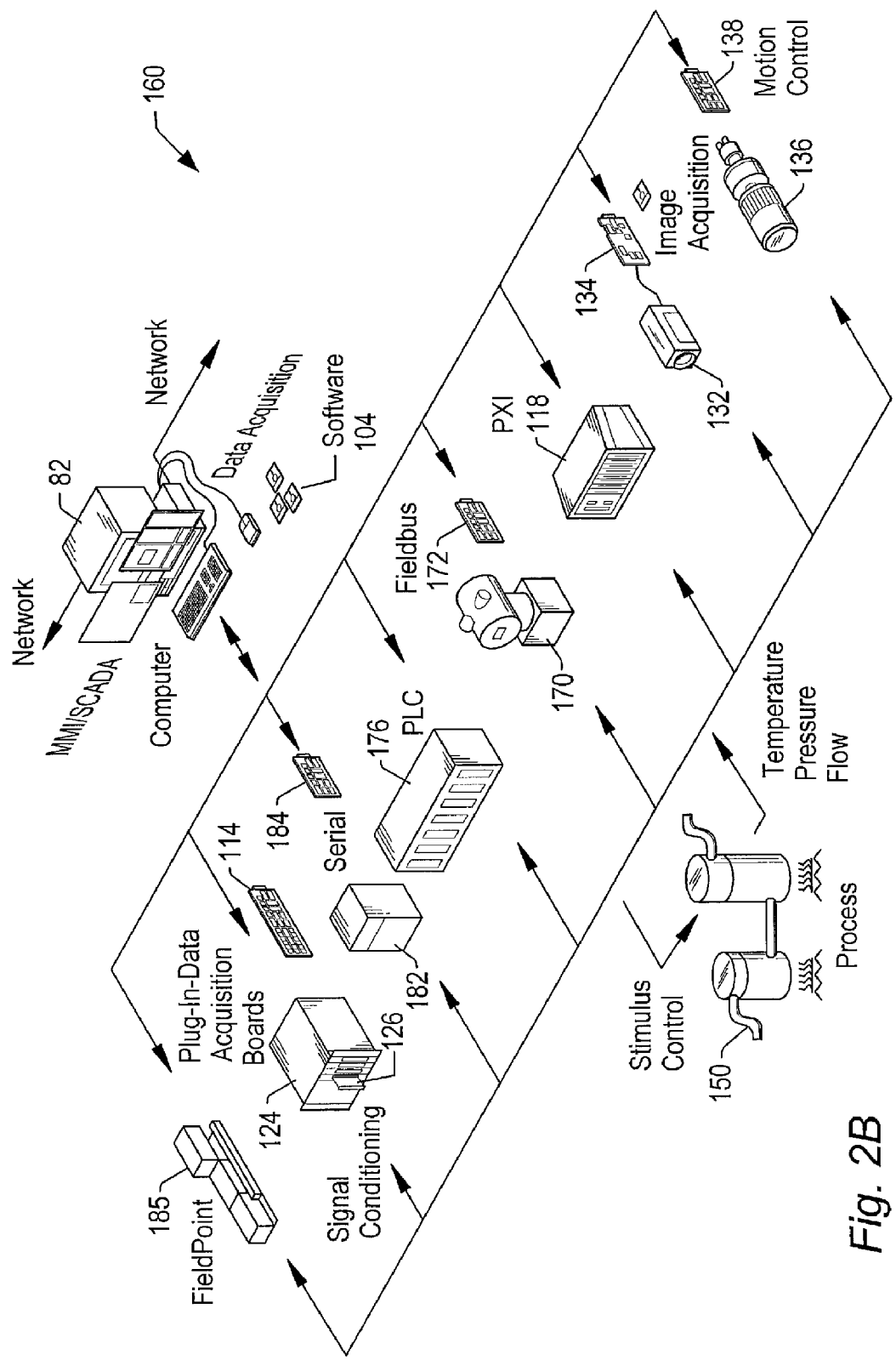
FIG. 2B illustrates an industrial automation system according to one embodiment of the invention.

FIG. 2B illustrates an exemplary industrial automation system 160 that may implement embodiments of the invention. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 which connects to one or more devices or instruments, where, for example, at least one of the devices or instruments includes a programmable hardware element, e.g., an FPGA, as described below in more detail. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control, among others.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Figure 3A:
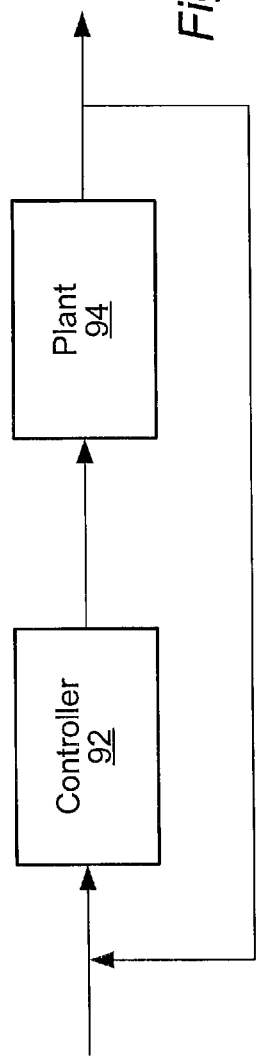
FIG. 3A is a high-level block diagram of an exemplary system that may execute or utilize graphical programs.

FIG. 3A is a high-level block diagram of an exemplary system that may execute or utilize graphical programs. FIG. 3A illustrates a general high-level block diagram of a generic control and/or simulation system that comprises a controller 92 and a plant 94. 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92. In some embodiments, the controller 92 may also be coupled to a reconfigurable device that includes a programmable hardware element, as described in detail below.

Figure 3B:
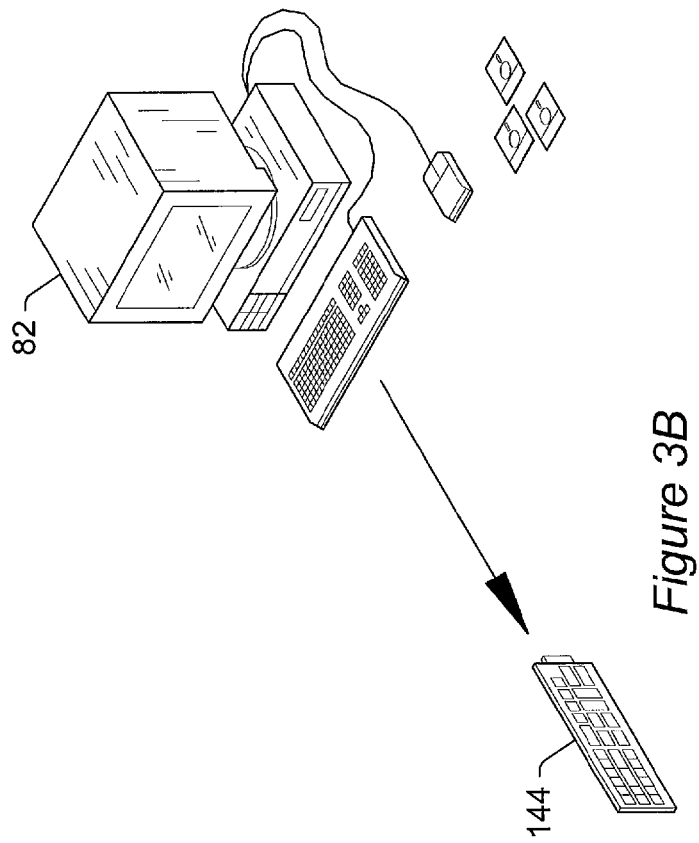
FIG. 3B illustrates an exemplary system that may perform control and/or simulation functions utilizing graphical programs.

FIG. 3B illustrates an exemplary system that may perform control and/or simulation functions. As shown, the controller 92 may be implemented by a computer system 82 or other device (e.g., including a processor and memory medium and/or including a programmable hardware element) that executes or implements a graphical program. In a similar manner, the plant 94 may be implemented by a computer system or other device 144 (e.g., including a processor and memory medium and/or including a programmable hardware element) that executes or implements a graphical program, or may be implemented in or as a real physical system, e.g., a car engine.

In one embodiment of the invention, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In one embodiment of the invention, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In one embodiment, the user operates to select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network. In preferred embodiments, described below, the user may create two (or more) graphical computer programs, one of which may be deployed to a reconfigurable device, and another that may execute on the computer or be deployed for execution on a controller. Note that, as used herein, the terms "computer system", and "controller" may all be used to refer to the execution platform for the first graphical program, where the execution platform is coupled to the reconfigurable device for cooperative execution of the two programs. As noted earlier, the computer system 82 (or another computer system) may be used to develop the graphical programs described herein.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 4:
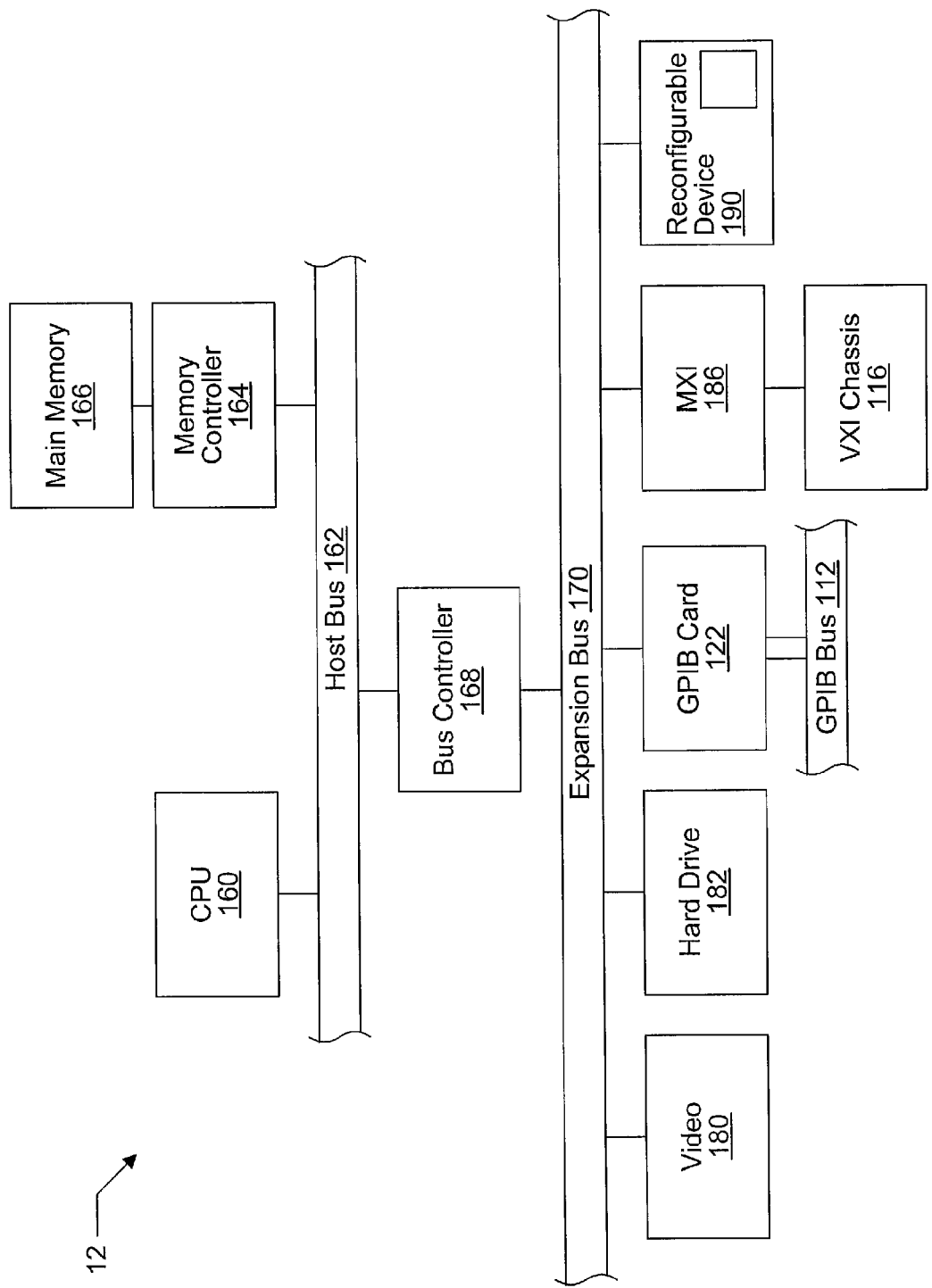
FIG. 4 is an exemplary block diagram of the computer systems of FIGS. 1A, 1B, 2A and 2B and 3B.

FIG. 4—Computer System Block Diagram

FIG. 4 is a block diagram representing one embodiment of the computer system 82 and/or 90 illustrated in FIGS. 1A and 1B, or computer system 82 shown in FIGS. 2A or 2B. It is noted that any type of computer system configuration or architecture can be used as desired, and FIG. 4 illustrates a representative PC embodiment. It is also noted that the computer system may be a general-purpose computer system, a computer implemented on a card installed in a chassis, or other types of embodiments. Elements of a computer not necessary to understand the present description have been omitted for simplicity. As noted above, the computer system may serve as a development platform, and/or a controller, as desired.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store graphical programs that implement embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. In some embodiments, the computer 82 may also include or be coupled to other buses and devices, such as, for example, GPIB card 122 with GPIB bus 112, an MXI device 186 and VXI chassis 116, etc., as desired.

As shown, a device 190 may also be connected to the computer. The device 190 preferably includes a programmable hardware element. The device 190 may also or instead comprise a processor and memory that may execute a real time operating system. The computer system may be operable to deploy a graphical program to the device 190 for execution of the graphical program on the device 190. The deployed graphical program may take the form of graphical program instructions or data structures that directly represent the graphical program.

Exemplary embodiments of the invention are described below with reference to FIGS. 7A and 7B, where computer system 82 is used as a controller, although it should be noted that in other embodiments, the controller may be separate and distinct from the computer system 82.

Figure 5:
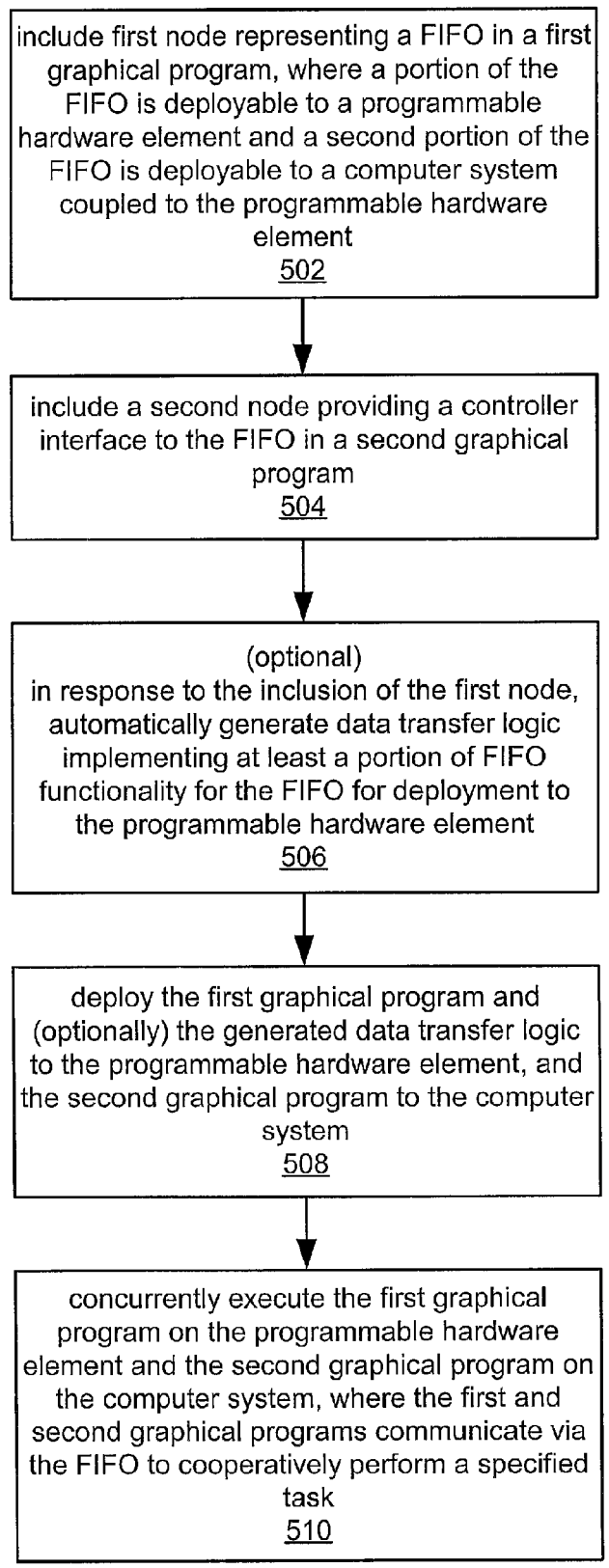
FIG. 5 is a flowchart diagram illustrating one embodiment of a method for enabling a graphical program executing on a controller to communicate with a graphical program executing on a programmable hardware element, according to one embodiment.

FIG. 5—Flowchart of Method for Communicating between Graphical Programs Executing Respectively on a Computer System and a Programmable Hardware Element FIG. 5 illustrates a method for communicating between programs executing respectively on a controller and a programmable hardware element, according to one embodiment. The method shown in FIG. 5 may be used in conjunction with any of the computer systems or devices shown in the above Figures, among other devices. In various embodiments, some of the method elements shown may be performed concurrently, in a different order than shown, or may be omitted. Additional method elements may also be performed as desired. In the exemplary embodiment shown in FIG. 5, the method may operate as follows.

First, in 502, a first node representing a FIFO structure (or simply "FIFO") may be included in a first graphical program in response to user input. In some embodiments, the first node may comprise a graphical representation of the FIFO. The first graphical program may comprise a first plurality of interconnected nodes that visually indicate functionality of the first graphical program. One simplified example of the first graphical program according to one exemplary embodiment is illustrated in FIG. 6A.

Figure 6A:
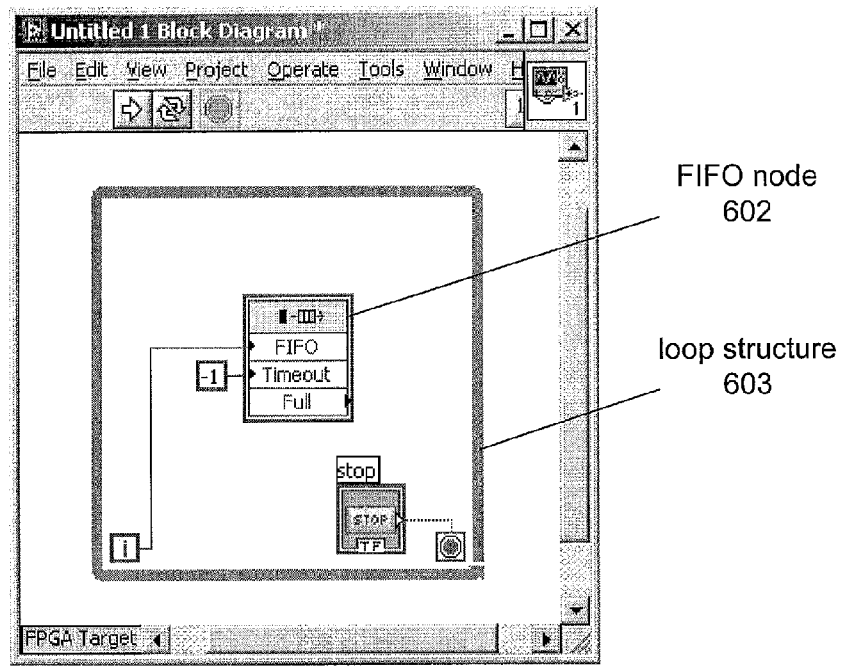
FIGS. 6A and 6B illustrate exemplary graphical programs implementing a FIFO structure, respectively executable on a programmable hardware element and a controller, according to one embodiment.

As may be seen, in the embodiment of FIG. 6A, the graphical program (i.e., block diagram) includes a loop structure 603, and the first node 602, which may be referred to as a FIFO node 602, has been included in the graphical program inside the loop structure 603, although it should be noted that in other embodiments, the node may be included otherwise, and the first graphical program may include various other graphical program elements as desired. Note that the graphical program of FIG. 6A also includes a stop node, so labeled, whereby the program execution may be stopped.

Figure 7A:
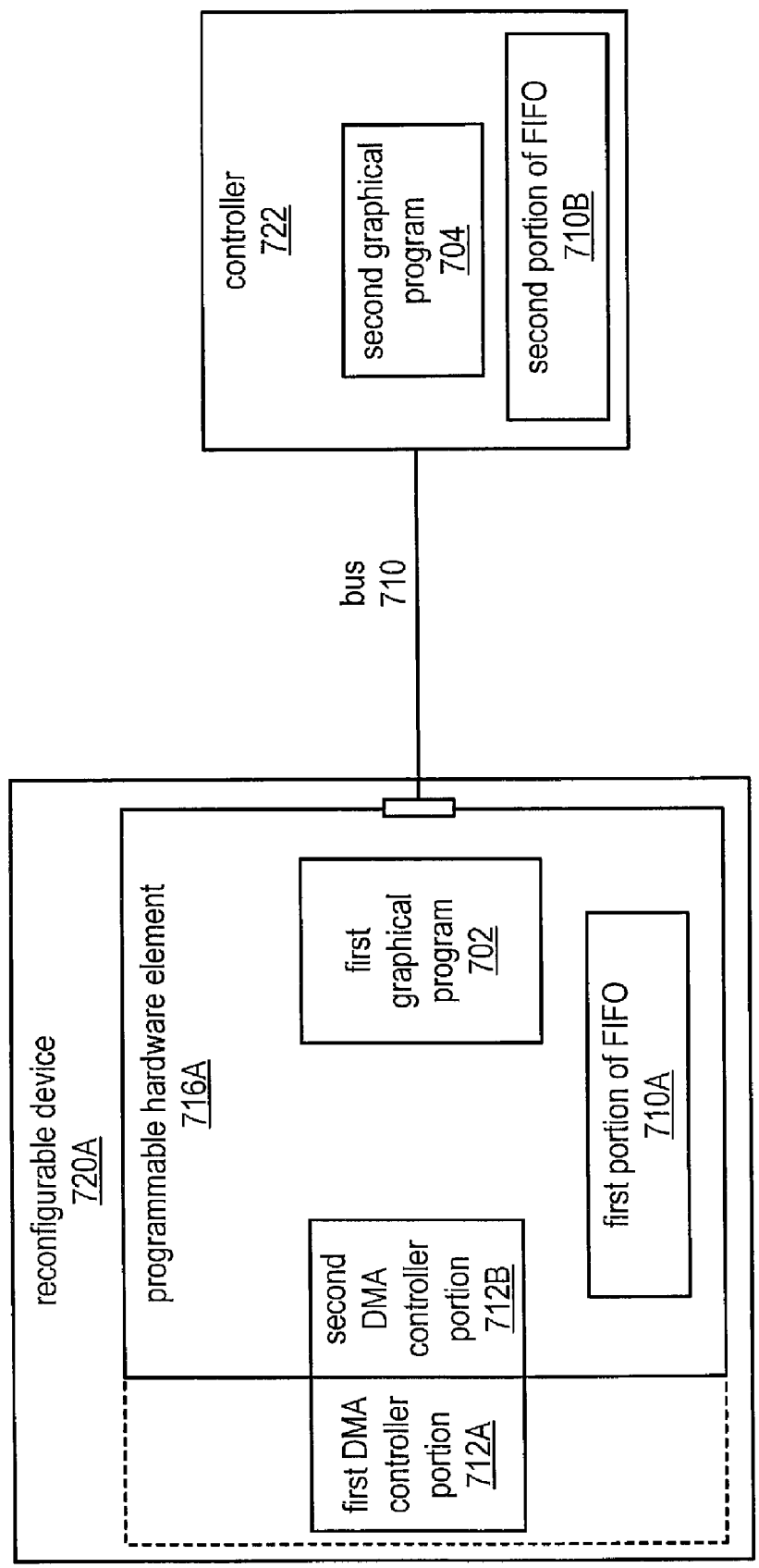
FIGS. 7A and 7B illustrate systems implementing various embodiments of the present invention.
Figure 7B:
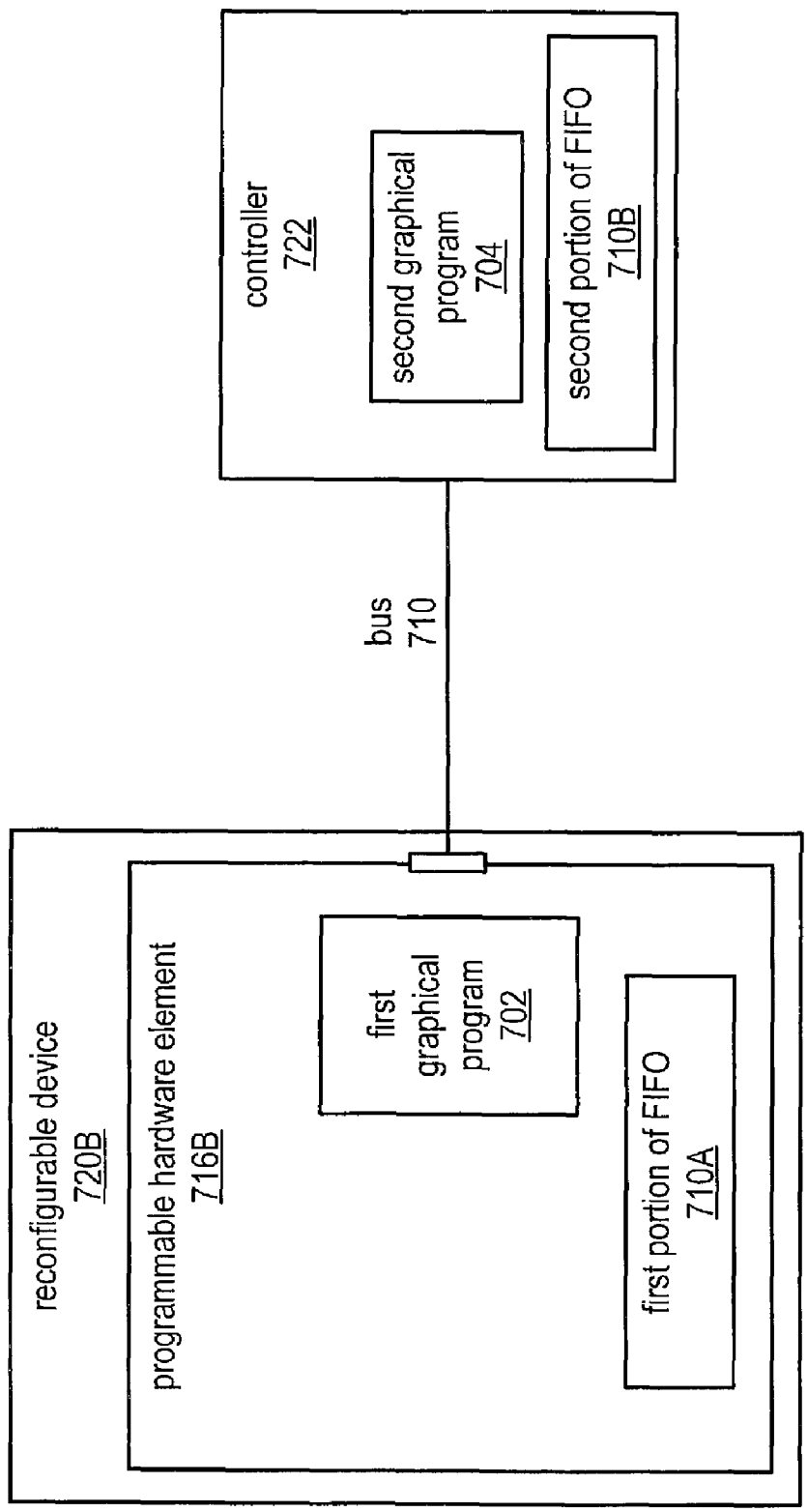

The first graphical program is intended for deployment and execution on a programmable hardware element, e.g., such as on reconfigurable device 720, shown in FIGS. 7A and 7B (or device 190, shown in FIG. 4, among other devices). As FIGS. 7A and 7B indicate, the reconfigurable device 720 (i.e., 720A or 720B) is coupled via bus 710 to computer system 82. Note that the bus 710 may be any type of transmission medium desired, including for example a transmission cable, a local area network (LAN), a wide area network (WAN), e.g., the Internet, etc., including wired or wireless transmission means, as desired. The embodiments of FIGS. 7A and 7B represent the system after deployment of the various components, e.g., the first graphical program 602, of the present invention to their respective execution platforms.

For example, in preferred embodiments, at least a first portion of the FIFO structure 710A is operable to be implemented on a programmable hardware element. For example, as indicated in FIGS. 7A and 7B, at least a first portion of the FIFO data storage elements may be operable to be implemented on a programmable hardware element 716A, e.g., an FPGA, of the reconfigurable device 720. As also indicated in FIG. 7A, in some embodiments, the FIFO structure may be implemented as a direct memory access (DMA) FIFO structure. In these embodiments, the reconfigurable device 720A may include a DMA controller 712, described in more detail below, although it should be noted that this is but one of numerous possible implementations of the FIFO structure contemplated. Note that as used herein, similar components distinguished from one another by use of label suffixes such as "A" and "B", e.g., reconfigurable devices 720A and 720B, may be referred to collectively or generically by the numeric label alone, e.g., reconfigurable device(s) 720.

In other embodiments, other techniques of data transfer may be used to interface to the FIFO. For example, in the embodiment shown in FIG. 7B, the reconfigurable device 720B does not include DMA logic coupled to or included in the programmable hardware element 716B, and DMA logic is not used to transfer the data.

There are two other common methods of doing device I/O other than DMA, known as programmed I/O and interrupt-driven I/O. Programmed I/O is completely under the control of the host processor (CPU) and the program that is running on it. The processor (CPU) may move data to and from the device by performing reads and writes to the device, e.g., via messages and/or registers. The processor may retrieve status information from the device (such as whether the data are ready) by also performing reads to the device, where reads and writes to the device may occur one after the other. Note that is a relatively slow method of moving data. For example, in waiting for a block of data on the device, the device may have to be continuously polled to check the status until the data are ready, and then move the data point by point by reading the device to put the data in host memory.

Interrupt-driven I/O is similar to programmed I/O in that the processor or CPU still moves data to and from the device by reading and writing to the device. However, in this approach status information may be received from the device by having the device send interrupts to the processor. This can be much more efficient than programmed I/O. Using the same example as for programmed I/O, in waiting for a block of data on the device, to check the status the device does not have to be continuously polled until the data are ready, rather, a process would simply register to receive an interrupt from the device and put the process thread to sleep until the interrupt was received, with no polling required. Data is still moved point by point by the processor by reading the device to put the data into host memory.

Thus, in some embodiments, the programmable hardware element may not be configured to control the data transfers. For example, in the embodiment of FIG. 7B, the data transfers are performed via the controller's processor, e.g., processor 160 of the computer system 82, or that of a different controller. In other words, instead of using DMA to transfer data to and from the FIFO, the controller's processor executes software instructions to perform the data transfers, referred to as programmed I/O.

Note that in some embodiments, the first node, e.g., the FIFO structure node 602 may be configurable to specify some attributes of the FIFO structure, e.g., may be configurable to specify one or more of: depth of the FIFO structure (described in more detail below), direction of the FIFO structure, i.e., controller memory to programmable hardware element, or programmable hardware element to controller memory, and the data type of the FIFO structure, among others. The FIFO structure node 602 may also be operable to provide status information for the FIFO structure, such as whether the FIFO (or the portion implemented on the programmable hardware element) is full, and so forth.

Figure 6B:
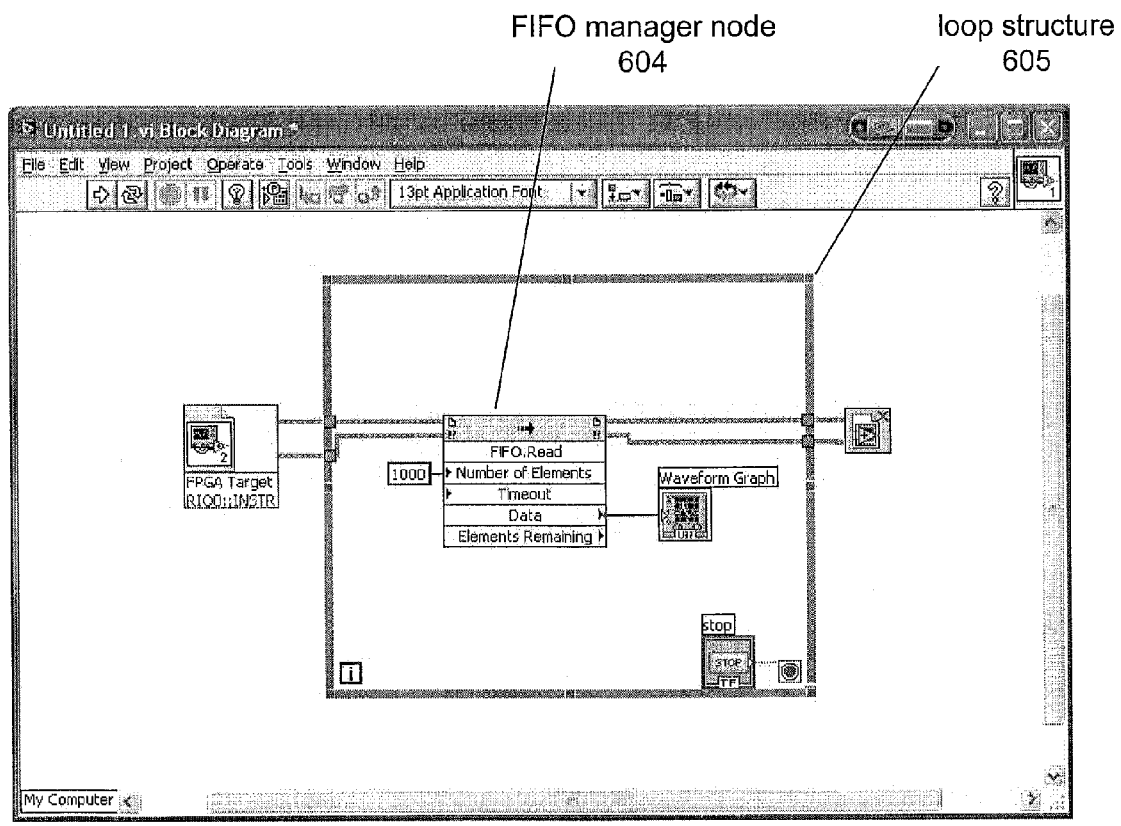

In 504, a second node may be included in a second graphical program in response to second user input, where the second node is operable to provide a controller interface to the FIFO structure. Like the first, the second graphical program may comprise a second plurality of interconnected nodes that visually indicate functionality of the second graphical program. The second graphical program is intended for deployment and execution on a controller, such as computer system 82 (or another computer system) or another controller. A simplified example of the second graphical program according to one exemplary embodiment is illustrated in FIG. 6B.

As may be seen, in this embodiment, the second graphical program (i.e., block diagram) includes a loop structure 605, and the second node, which may be referred to as a FIFO manager node, contained therein. As with the graphical program of FIG. 6A, a stop node is provided for terminating execution of the program. Additionally, as shown, data from the FIFO manager node is provided to a waveform graph node for graphical display of the data. At the far left of the block diagram (outside the loop structure) is an FPGA target node, labeled "FPGA Target", that operates to open a communication session between the second graphical program and the programmable hardware element 716.

In preferred embodiments, a second portion of the FIFO structure is operable to be implemented in memory of a controller 722, e.g., computer system 82. For example, as illustrated in FIGS. 7A and 7B, a second portion of the FIFO 710B, e.g., a second portion of the FIFO's data storage elements, may be operable to be implemented in the memory of the controller 722 (or computer system 82 or another computer system). Thus, the FIFO structure 710 may be comprised on both the programmable hardware element 716 (716A or 716B) and the controller 722, and thus may comprise a distributed FIFO.

Note that in some ways, the first and second nodes are functionally equivalent, except that the second node (on the controller side) can read and write multiple points from the structure, e.g., FIFO, at a time. At a high level, both nodes operate to read and write data from the structure. However, at a deeper level, the first node (on the hardware element side) is responsible for instantiating the hardware part of the structure, and in some embodiments (e.g., see FIG. 7A), for creating data transfer logic, e.g., custom DMA logic, while the first node interacts with the hardware to signal when data is ready, or is ready to receive more data.

In alternate embodiments, the structure used for such communication may be completely implemented in only the controller 772, or the structure may be completely implemented only in the programmable hardware element. However, it should be noted that in these cases, data transfer logic, e.g., direct memory access (e.g., some or all of the data transfer logic, e.g., DMA logic) may not be needed since the structure is not distributed over the two devices. As noted above, in some embodiments (e.g., see FIG. 7B), the data transfer may be performed by the processor of the controller.

In further embodiments, the first and second nodes may be capable of the same functionality. For example, each of the first and second node may represent the FIFO structure, and each node may also be capable of providing an interface to the FIFO structure, e.g., for configuring the FIFO structure. Each node may only utilize the functionality required by the specific use, e.g., may be context sensitive, such that the appropriate functionality may be provided automatically, e.g., in response to the configuration, deployment, etc. In some embodiments, the two nodes may have the same appearance, while in other embodiments, the appearances may differ, e.g., based on the configuration, use, context, etc.

As noted above, the embodiments shown in FIGS. 7A and 7B illustrate the system after deployment of various components of the present invention to their respective execution platforms. For example, the second graphical program 704 is shown deployed to the controller 722 (which in some embodiments may be computer system 82).

In preferred embodiments, the second node, e.g., the FIFO manager node 604 may be configurable to specify a desired function of the FIFO structure. For example, the second node may be operable to receive input specifying FIFO read operations, FIFO write operations, FIFO start operations, FIFO stop operations, and FIFO configure operations, among other FIFO methods or functionality. For example in one embodiment, to specify a desired function of the FIFO structure, one or more selectable options for specifying the desired function of the FIFO structure may be provided, and input, e.g. user input, may be received selecting one of the one or more selectable options to specify the desired function of the FIFO structure, after which, the second node may be executable to invoke or perform the desired function of the FIFO structure.

In various embodiments, the selectable options may be provided by program code, e.g., program instructions, stored in the memory of the computer system 82, e.g., comprised in the development environment in which the graphical program is being written and/or by the second node or program code associated with the second node. For example, in preferred embodiments, e.g., where the second node functions as a user interface node (i.e., is capable of displaying information and/or receiving input), the node may include both edit time and runtime program code, where the edit time code implements functionality that may operate at edit time, and where the runtime code operates at runtime, the edit time code of the node may execute to provide the options. In preferred embodiments, such edit time code of the second node may operate in conjunction with other program code, e.g., program code comprised in the development environment, e.g., the graphical program editor, to manage the presentation and selection of the options.

In the example of FIG. 6B, various attributes or fields of the FIFO structure are displayed by the node, e.g., "FIFO Read", "Number of Elements", "Timeout", "Data", and "Elements Remaining", although other fields or attributes may be used as desired. Note that provision of the selectable options may be invoked in any of a variety of ways. For example, in one embodiment, the user may click (e.g., left-click, right-click, double click, etc., of a mouse or other pointing device) on the node to invoke display of the options, e.g. in a drop-down display of the node. The user may then select one of the options to specify the desired functionality of the FIFO structure, e.g., by clicking on the desired option. Of course, any other means for providing, displaying, and/or selecting the selectable options are also contemplated, the above being but an exemplary manner of doing so.

Once the selection has been made, i.e., once the node/FIFO structure has been configured to provide the desired functionality, the second node may represent the specified functionality of the FIFO structure in the second graphical program. For example, if FIFO read functionality were selected, the second node may then function as a FIFO read node in the second graphical program. In one embodiment, the appearance of the second node may be automatically modified to reflect or indicate the specified functionality, e.g., the node's icon, color, shape, or label, may be modified in accordance with the selected option.

In some embodiments, to provide the one or more selectable options for specifying the desired function of the FIFO structure, program code, e.g., comprised in the development environment and/or the second node, and/or associated with the second node, may be operable to determine the FIFO structure's configuration, and only provide or present options that are in accordance with the FIFO structure's configuration. In other words, the options provided by or for the second node may be based on the FIFO structure's configuration. For example, in one embodiment, the development environment (e.g., editor), the second node, and/or program code associated with the second node, may access and analyze configuration information included in, or associated with, the FIFO structure node, i.e., the first node, described above. Based on this configuration information, only those options that are consonant with the configuration information, i.e., with the configured capabilities of the FIFO structure, may be presented.

In some embodiments, determining the FIFO structure's configuration may include accessing edit time source code of the first node, and/or a compiled bit file generated from the source code of the first node. For example, in one embodiment, the editor (of the development environment) may access the first graphical program source code, e.g., via a project that includes the source code for both the first and second graphical programs. As another example, the editor (or node or associated code) may access the compiled bit file generated from the source code of the first node, and thus this access may be performed after compilation.

In some embodiments, at least one of the one or more selectable options may specify a first function that requires one or more corollary functions. For example, in one embodiment, FIFO read functionality may always require prior performance of a FIFO start function, for example, or a validate state function; thus, a selected option specifying FIFO read operations may automatically specify inclusion of the FIFO start or validate functionality in the graphical program, along with the FIFO read functionality, this being but one simple example. In preferred embodiments, this automatic inclusion of corollary functionality based upon selected FIFO function options is transparent to the user. For example, in some embodiments, the graphical program may not contain any visible graphical program elements specifically indicating or representing the corollary functionality. Thus, if the second node is configured to invoke the first function, the second node may be executable to automatically invoke the one or more corollary functions in addition to the first function.

Alternatively, in other embodiments, in response to the selection of the option, the one or more additional graphical program elements, e.g., nodes, indicating or representing the corollary functionality associated with the selected option may automatically be included and displayed in the graphical program.

It should be noted that the first graphical program, including the first node, is preferably deployable to the programmable hardware element, while the second graphical program, including the second node, is preferably deployable to the controller 722, or computer system 82, where the first and the second graphical program are executable to communicate via the FIFO structure to cooperatively perform a specified task.

The first and second graphical programs may be created on the computer system 82, or on a different computer system. For each of the graphical programs, the graphical program may be created or assembled by the user arranging on a display a plurality of nodes or icons and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons that visually indicates the functionality of the program. As noted above, the graphical program may comprise a block diagram and may also include a user interface portion or front panel portion. Where the graphical program includes a user interface portion, the user may optionally assemble the user interface on the display. As one example, the user may use the LabVIEW graphical programming development environment to create the graphical program.

In an alternate embodiment, at least one of the graphical programs may be created by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired.

As noted above, in various embodiments, the FIFO structure may be implemented in any of a variety of ways. For example, in some embodiments, the FIFO structure may utilize data transfer logic for transferring data between portions of the FIFO structure. In different embodiments, the data transfer logic may be implemented in software, and/or hardware, and may be comprised in one or both of the controller and the reconfigurable device.

For example, in one embodiment, the FIFO structure may be implemented as a Direct Memory Access (DMA) FIFO, where DMA is used to transfer data between the two portions of the FIFO. As is well known in the art of memory access and management, a DMA controller is generally used to facilitate direct access to memory. Thus, in embodiments of the present system where the FIFO structure is a DMA FIFO (see, e.g., FIG. 7A), the reconfigurable device 720A may require data transfer logic in the form of a DMA controller, i.e., DMA logic, e.g., which may be either coupled to or implemented on the programmable hardware element 716A. For example, in one embodiment, the DMA controller may be included on the same circuit board as the programmable hardware element, and may be communicatively coupled thereto to facilitate direct memory access by the DMA FIFO, e.g., by the programmable hardware element, of the portion of the DMA FIFO comprised in the memory of the controller (or computer system 82). However, in some embodiments, the DMA controller may not inherently support or provide FIFO functionality, and so custom logic may need to be generated, as described below.

As indicated in 506, in embodiments where data transfer logic, e.g., a memory controller, is required to transfer data between portions of the FIFO, at least a portion of this data transfer logic may be automatically generated in response to including the first node in the first graphical program, and may be generated in accordance with configuration information for the FIFO. For example, in embodiments where the FIFO is a DMA FIFO, at least a portion of the DMA controller, i.e., additional DMA logic, may be automatically generated in response to including the first node in the first graphical program, and may be generated in accordance with configuration information for the DMA FIFO. The at least a portion of DMA logic may be deployable to the programmable hardware element to implement FIFO functionality for the DMA controller, e.g., to implement the DMA FIFO functionality.

In 508, the first graphical program, and optionally the at least a portion of data transfer logic, e.g., of DMA logic, may be deployed to the programmable hardware element. For further information regarding deployment of a graphical program to a programmable hardware element, please see U.S. patent application Ser. No. 08/912,427 titled "System and Method for Converting Graphical Programs Into Hardware Implementations" filed on Aug. 18, 1997, which was incorporated by reference above. The second graphical program may be deployed to the controller (or computer system 82). Note that deploying the second graphical program to the computer system 82 may simply mean compiling the program for execution by the processor, placing the program in a particular directory, or otherwise making sure that the second graphical program is properly executable by the computer system 82, since in preferred embodiments, the second graphical program is developed on the computer system 82, and thus may already be present.

Referring again to FIG. 7A, an exemplary system is shown after the deployments of 508, where in this embodiment, the FIFO structure is a DMA FIFO, and data transfer logic in the form of a DMA controller is included in and/or coupled to the programmable hardware element. In this embodiment, the DMA controller 712 is shown comprising first and second portions, 712A and 712B. As indicated in FIG. 7A, in some embodiments, the first DMA controller portion 712A may be coupled to the programmable hardware element 716A, but may not actually be implemented on the programmable hardware element. This aspect is illustrated in FIG. 7A by situating the first DMA controller portion 712A outside the drawn solid boundaries of the programmable hardware element 716A. In another embodiment, also represented in FIG. 7A, the first DMA controller portion 712A may be deployed to and comprised on the programmable hardware element 716A. This aspect is illustrated in FIG. 7A by enclosing the first DMA controller portion 712A within the dashed line boundary of the programmable hardware element.

The second DMA controller portion 712B is shown comprised on the programmable hardware element 716A. In other words, in the embodiment shown in FIG. 7A, the second DMA controller portion 712B has been deployed for execution on the programmable hardware element 716A.

Node that in various other embodiments, the DMA controller 712 may be comprised entirely on the programmable hardware element 716A, or, alternatively, may not be comprised on the programmable hardware element 716A at all, i.e., may simply be coupled to the programmable hardware element.

Thus, in some embodiments, the system may include the computer system 82, where the computer system includes a processor and memory, the programmable hardware element 716A, coupled to the computer system, and data transfer logic, in the form of a DMA controller comprised on and/or coupled to the programmable hardware element. In one embodiment, the DMA controller may include first DMA logic, coupled to or comprised on the programmable hardware element, where the first DMA logic implements DMA functionality, and second DMA logic, comprised on the programmable hardware element, where the second DMA logic implements FIFO functionality for the first DMA logic. Once the first and second graphical programs (and possibly some or all of the DMA controller logic) have been deployed, the DMA controller may be operable to receive instructions from the first node and the second node and directly transfer data between the programmable hardware element and the memory of the computer system in accordance with the received instructions.

In 510, the first graphical program may be executed on the programmable hardware element, and the second graphical program may be executed on the controller concurrently with the execution of the first graphical program to cooperatively perform the specified task. During the execution, the first and the second graphical programs may communicate via the FIFO to cooperatively perform the specified task. Note that in embodiments where the FIFO structure is implemented as a DMA FIFO, the FIFO (possibly in conjunction with the DMA controller) preferably facilitates direct memory access of the controller memory, specifically, FIFO storage elements comprised in the memory of the controller, by the first graphical program, during execution. In other embodiments, the FIFO may rely on the processor of the controller to manage the data transfers, e.g., via messages, registers, and/or interrupts.

Figure 8A:
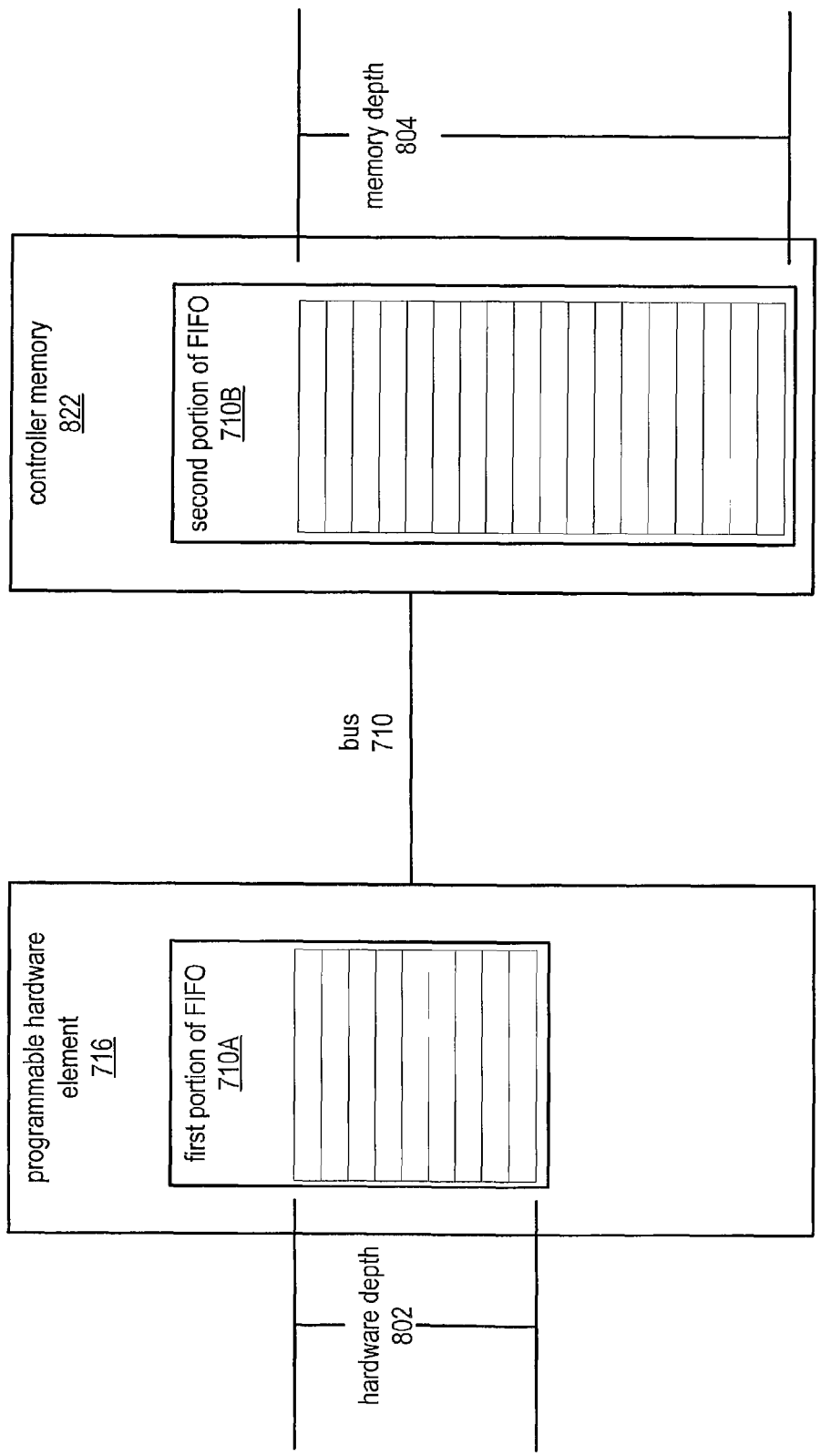
FIGS. 8A and 8B illustrate simplified block diagrams of a FIFO structure, according to one embodiment.
Figure 8B:
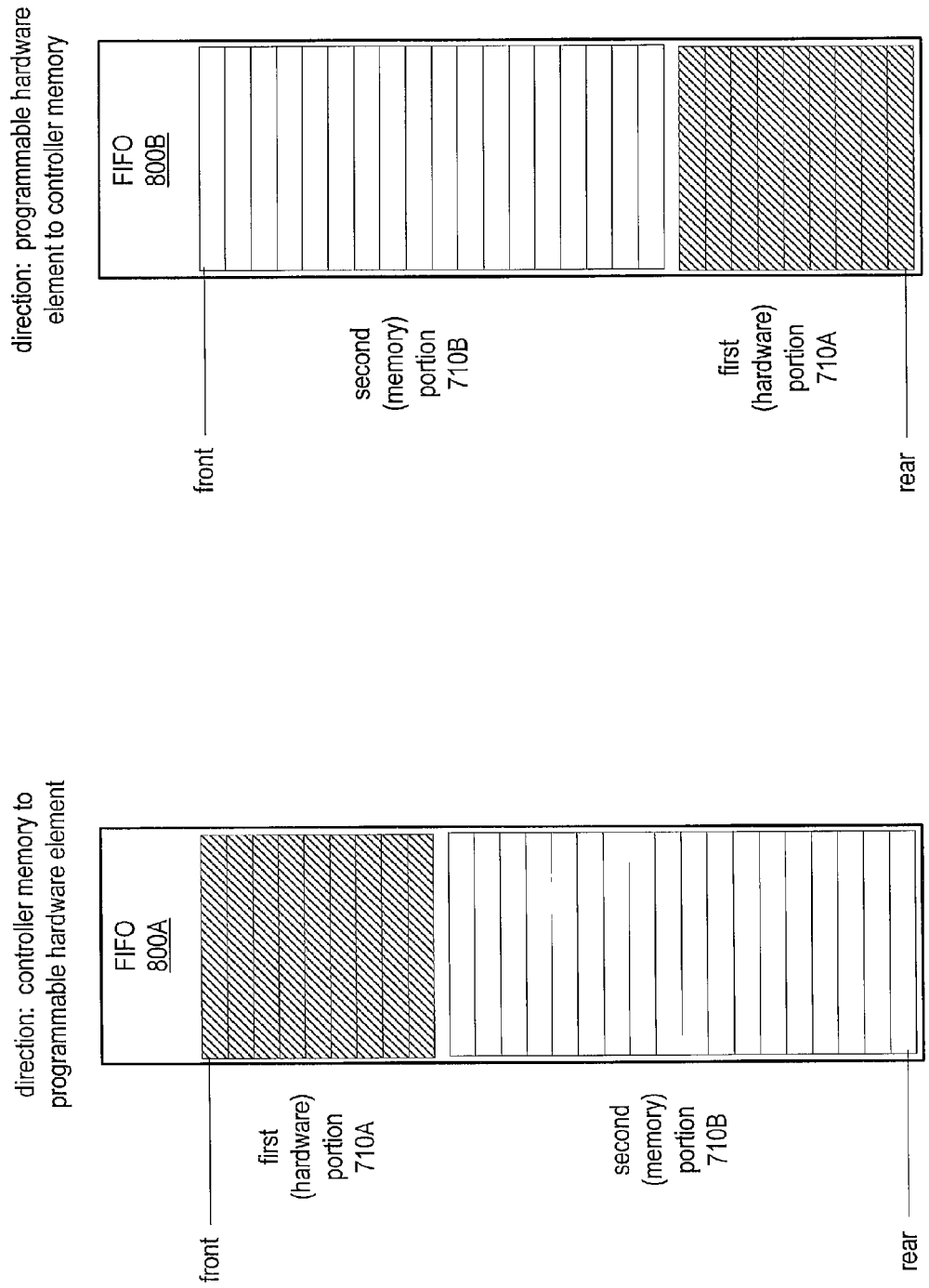

FIGS. 8A And 8B—FIFO Structure

FIGS. 8A and 8B are high-level block diagrams of a FIFO structure, according to one embodiment of the invention. Note that the FIFO structures shown in FIGS. 8A and 8B are intended to be exemplary only, and are not intended to limit the form or function of the FIFO structure to any particular implementation.

As FIG. 8A shows, and as described above, the first portion of the FIFO structure 712A may be comprised on the programmable hardware element 716, while the second portion of the FIFO structure 712B may be comprised in the memory 822 of the controller 722 (or of computer system 82), where the programmable hardware element 716 and the memory 822 of the controller 722 are coupled via transmission medium 710.

As noted above, the FIFO structure has various attributes that determine at least part of the physical implementation and operation of the FIFO structure, including for example, depth, direction, and data type, of the FIFO structure, each configurable by one or more of the first and second nodes described above.

In one embodiment, the depth of the FIFO structure may include a hardware depth 802, comprising a depth (number of storage elements) of the first portion of the FIFO structure, and a memory depth 804, comprising a depth (number of storage elements) of the second portion of the FIFO structure, where the depth comprises the sum of the hardware depth and the memory depth. The memory depth 804 may have a default configuration of twice the hardware depth 802, although any other values may be used as desired.

Note that in preferred embodiments, the hardware depth of the FIFO structure may be configurable at compile time, while the memory depth of the FIFO structure may be configurable at run time. One reason for this asymmetry is that the program code implementing the first portion of the FIFO structure, i.e., that portion deployed to the programmable hardware element, must be compiled and otherwise processed to generate a hardware configuration program that is then deployed to the programmable hardware element, and thus the hardware depth must be specified and configured at or before compile time. In contrast, the second portion of the FIFO structure, i.e., that portion deployed to the controller memory, is implemented in memory, e.g., in random access memory (RAM), which is suitable for dynamic configuration, and so the memory depth may be configured at run time.

As is well known in the art of data structures, the FIFO structure preferably includes a front, from which data may be read, and a rear, to which data may be written. Because the FIFO structure is intended to facilitate communications between the programmable hardware element (e.g., the first graphical program implemented thereon) and the controller (e.g., the second graphical program implemented thereon), the front of the FIFO structure may be comprised on one of the devices, while the rear of the FIFO structure may be comprised on the other. The specific placement of the front and rear depends upon the direction of the FIFO, which is determined by the direction of the communication between the devices.

Note that the direction dependence of the placement of the front and rear of the FIFO structure may be at least in part due to the nature of data transfer logic (e.g., hardware or software) that may be used (in some embodiments), e.g., in embodiments where, for example, the DMA controller that actually performs the data transfers between the two portions of the DMA FIFO operates in a "greedy" manner. More specifically, the DMA controller (and DMA FIFO) may operate in such a way as to maximize the locality of the data to be retrieved, i.e., placing the front of the DMA FIFO from which data are retrieved on the device where the retrieved data will be used. One benefit of this is that if the bus 710 becomes inoperable for any reason the user of the data (i.e., the first or second graphical program) may continue to retrieve data for a time, i.e., whatever data are stored in the local portion of the FIFO may be retrieved, even though no data are being transmitted across the bus 710. Similarly, when the bus 710 is inoperable, the entity inserting data into the FIFO may continue to do so, since the rear of the FIFO is located on the same device as that entity.

FIG. 8B illustrates this aspect of the FIFO, according to one embodiment. As indicated in FIG. 8B, if the direction of the FIFO is configured to be memory to hardware, i.e., controller memory to programmable hardware element, the first (hardware) portion of the FIFO includes the front of the FIFO and the second portion of the FIFO includes the rear of the FIFO, as indicated by FIFO 800A. Alternatively, if the direction of the FIFO is configured to be hardware to memory, i.e., programmable hardware element to controller memory, the first portion of the FIFO includes the rear of the FIFO and the second portion of the FIFO includes the front of the FIFO, as indicated by FIFO 800B.

Thus, if communication from the controller to the programmable hardware element is desired, the FIFO may be configured with the controller memory to programmable hardware element direction (800A). In this case, the controller (e.g., the second graphical program) may insert data at the rear of the FIFO (which is preferably comprised in controller memory), and the programmable hardware element (e.g., the first graphical program) may retrieve that data at the front of the FIFO (which is preferably comprised on the programmable hardware element).

Conversely, if communication from the programmable hardware element to the controller is desired, the FIFO may be configured with the programmable hardware element to controller memory direction (800B). In this case, the programmable hardware element (e.g., the second graphical program) may insert data at the rear of the FIFO (which is preferably comprised on the programmable hardware element), and the controller (e.g., the first graphical program) may retrieve that data at the front of the FIFO (which is preferably comprised in controller memory).

Figure 9:
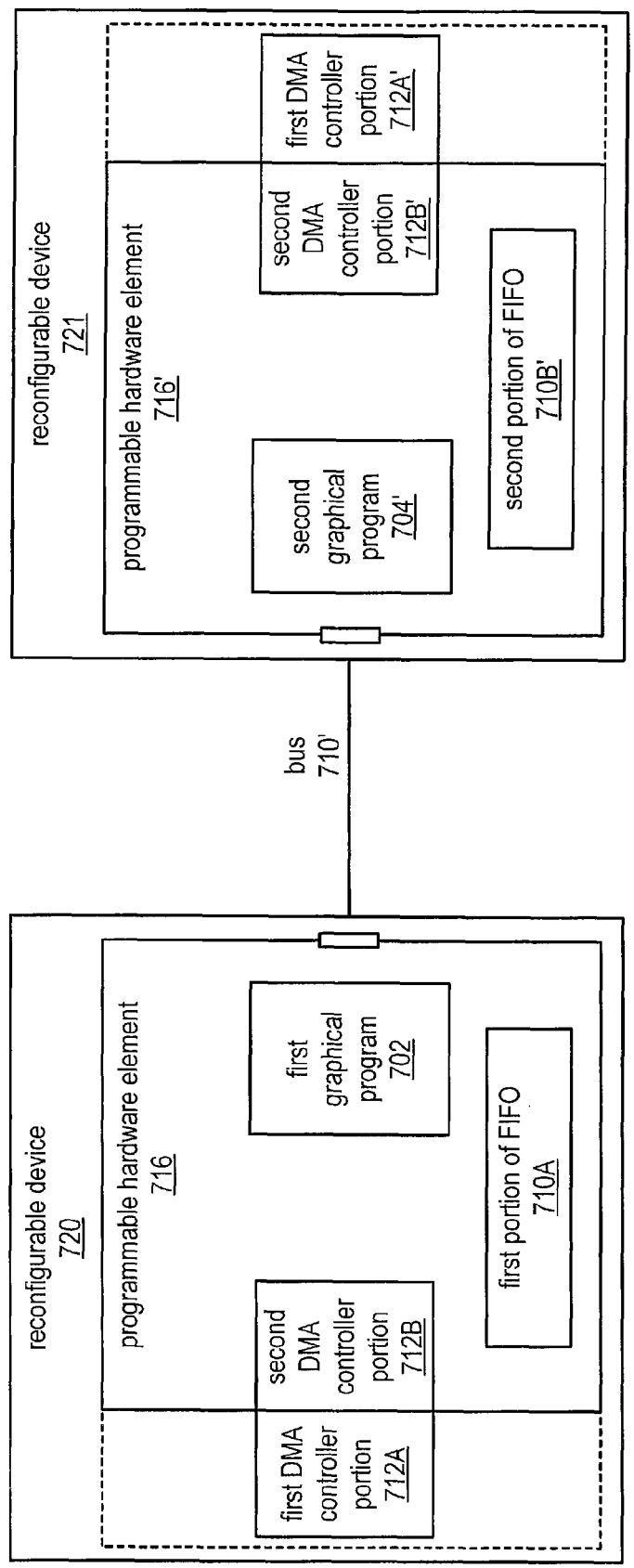
FIG. 9 illustrates an embodiment of a FIFO implemented on two reconfigurable devices including respective programmable hardware elements, according to one embodiment.

FIG. 9—FIFO Distributed among Multiple Programmable Hardware Elements

In some embodiments, the FIFO may be used for communication among reconfigurable devices (e.g., that each include respective programmable hardware elements), instead of between a reconfigurable device and a controller. FIG. 9 illustrates such an alternative embodiment. As shown, reconfigurable device 720 (a first reconfigurable device), described above with reference to FIG. 7, may be coupled to another reconfigurable device 721 (a second reconfigurable device) instead of controller 722. As described above with reference to FIG. 7, in some embodiments, the first reconfigurable device 720 includes programmable hardware element 716, configured with data transfer logic, such as DMA controller 712 (optionally as first and second portions 712A and 712B), a first graphical program 704, and a first portion of FIFO 710A.

The second reconfigurable device 721 shown is substantially similar to reconfigurable device 720, where similar but possible variant elements are labeled with a "prime" indicator. For example, in embodiment shown, the reconfigurable device 721 includes programmable hardware element 716', whereupon are configured respective data transfer logic, such as DMA controller 712' (optionally as first and second portions 712A' and 712B'), a second graphical program 704', and a second portion of the FIFO 710B'.

Thus, the second reconfigurable device replaces the controller (722) in FIG. 7. Instead of data moving between a programmable hardware element and a controller, data moves between two programmable hardware elements without the need for a controller. Note that in the embodiment of FIG. 9, the FIFO is still distributed, but now both portions are implemented in reconfigurable devices 720 and 721, instead of one portion being implemented in a reconfigurable device and one being implemented in the memory of the controller 722.

Note also that since both portions of the FIFO are implemented in reconfigurable devices, the depths of both portions of the FIFO must be set at compile time, in contrast to the implementation of FIG. 7, the controller memory part of the FIFO may be specified at runtime.

Note further that this embodiment still facilitates communication between two different graphical programs. However, in this embodiment, both graphical programs are preferably comprised of nodes suitable for implementation on programmable hardware elements, such as those used in the graphical program shown FIG. 6A, since these nodes are representative of programming constructs that run on reconfigurable hardware. Thus, nodes such as those used in the program of Figure B should not be used, since these nodes are representative of programming constructs that execute on controllers.

It should be noted that while in the embodiment shown in FIG. 9, each of the reconfigurable devices includes DMA logic (712 and 712'), in other embodiments, one of the reconfigurable devices may not include data transfer logic, e.g., DMA controller 712 or 712'. In other words, in some embodiments, the data transfer logic of one of the reconfigurable devices may operate to transfer data with respect to both reconfigurable devices.

Thus, in some embodiments, the FIFO may be implemented and used for communication between two graphical programs running on two different reconfigurable hardware elements.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A computer-implemented method for communicating between programs executing respectively on a controller and a programmable hardware element, the method comprising:
    creating a first graphical program in response to first user input, wherein the first graphical program comprises a first plurality of interconnected nodes that visually indicate functionality of the first graphical program, wherein the first graphical program includes a first node that represents a first in first out (FIFO) structure;
    creating a second graphical program in response to second user input, wherein the second graphical program comprises a second plurality of interconnected nodes that visually indicate functionality of the second graphical program, wherein the second graphical program includes a second node that provides an interface to the FIFO structure;
    deploying the first graphical program to the programmable hardware element;
    configuring at least a portion of the FIFO structure on the programmable hardware element;
    deploying the second graphical program to the controller;
    wherein the first graphical program and the second graphical program are executable to communicate via the FIFO structure to cooperatively perform a specified task.

2. The method of claim 1, the method further comprising:
    automatically generating at least a portion of data transfer logic in response to said including the first node and in accordance with configuration information for the FIFO structure, wherein the at least a portion of data transfer logic is deployable to the programmable hardware element to implement data transfer functionality for the FIFO structure.

3. The method of claim 2, further comprising:
    deploying the at least a portion of data transfer logic to the programmable hardware element, wherein said executing the first graphical program on the programmable hardware element further comprises executing the at least a portion of the data transfer logic to facilitate communications between the first and second graphical programs.

4. The method of claim 2,
    wherein the FIFO structure is a Direct Memory Access (DMA) FIFO; and
    wherein the data transfer logic comprises DMA logic.

5. The method of claim 4, wherein the DMA logic comprises at least a portion of a DMA controller.

6. The method of claim 1, wherein data are transferred between the first and second graphical programs via program instructions executed by the controller.

7. The method of claim 6, wherein the data are transferred between the first and second graphical programs via program instructions executed by the controller using one or more of:
    programmed I/O; or
    interrupt-driven I/O.

8. The method of claim 1, wherein said deploying the first graphical program to the programmable hardware element comprises:
    generating a hardware configuration program based on the first graphical program; and
    deploying the hardware configuration program on the programmable hardware element.

9. The method of claim 8, wherein the first node is configurable to specify one or more of:
    depth of the FIFO structure;
    direction of the FIFO structure, comprising one of:
        controller memory to programmable hardware element; and
        programmable hardware element to controller memory; and
    data type of the FIFO structure.

10. The method of claim 9, wherein the depth of the FIFO structure comprises:
    a hardware depth, comprising a depth of the first portion of the FIFO structure;
    a memory depth, comprising a depth of the second portion of the FIFO structure; and
    wherein the depth comprises the sum of the hardware depth and the memory depth.

11. The method of claim 10,
    wherein the hardware depth of the FIFO structure is configurable at compile time; and
    wherein the memory depth of the FIFO structure is configurable at run time.

12. The method of claim 9,
    wherein the FIFO structure comprises a front, from which data may be read, and a rear, to which data may be written; and
    wherein, if the direction of the FIFO structure is configured to be memory to programmable hardware element, the first portion of the FIFO structure includes the front of the FIFO structure and the second portion of the FIFO structure includes the rear of the FIFO structure, and if the direction of the FIFO structure is configured to be programmable hardware element to memory, the first portion of the FIFO structure includes the rear of the FIFO structure and the second portion of the FIFO structure includes the front of the FIFO structure.

13. The method of claim 1, wherein the second node is configurable to specify a desired function of the FIFO structure.

14. The method of claim 13, wherein the desired function of the FIFO structure comprises one or more of:
read operations;
write operations;
start operations;
stop operations; and
configure operations.

15. The method of claim 14, wherein said specifying a desired function of the FIFO structure comprises:
providing one or more selectable options for specifying the desired function of the FIFO structure; and
receiving input selecting one of the one or more selectable options to specify the desired function of the FIFO structure;
wherein, after said selecting, the second node is executable to invoke the desired function of the FIFO structure.

16. The method of claim 15,
wherein at least one of the one or more selectable options specifies a first function that requires one or more corollary functions; and
wherein, if the second node is configured to invoke the first function, the second node is executable to automatically invoke the one or more corollary functions in addition to the first function.

17. The method of claim 15, wherein providing the one or more selectable options for specifying the desired function of the FIFO structure comprises:
determining the FIFO structure's configuration; and
providing only options that are in accordance with the FIFO structures's configuration.

18. The method of claim 17, wherein said determining the FIFO structure's configuration comprises one or more of:
edit time source code of the first node; and
a compiled bit file generated from the source code of the first node.

19. The method of claim 17, wherein said determining the FIFO structure's configuration is performed by one or more of:
edit time code for the second node;
program code associated with the second node; and
a development environment of the second graphical program.

20. The method of claim 13, wherein the second graphical program includes one or more additional second nodes, each operable to provide a respective additional controller interface to the FIFO structure, and wherein each additional second node is configurable to specify a respective desired function of the FIFO structure;
wherein, after being configured, each additional second node is executable to invoke the respective desired function of the FIFO structure.

21. The method of claim 1, further comprising:
configuring at least a portion of the FIFO structure on the controller.

22. A non-transitory memory medium that stores program instructions for communicating between programs executing respectively on a controller and a programmable hardware element, wherein the program instructions are computer-executable to perform:
creating a first graphical program in response to first user input, wherein the first graphical program comprises a first plurality of interconnected nodes that visually indicate functionality of the first graphical program, wherein the first graphical program includes a first node that represents a first in first out (FIFO) structure;
creating a second graphical program in response to second user input, wherein the second graphical program comprises a second plurality of interconnected nodes that visually indicate functionality of the second graphical program, wherein the second graphical program includes a second node that provides an interface to the FIFO structure;
deploying the first graphical program to the programmable hardware element;
deploying the second graphical program to the controller;
wherein the first graphical program and the second graphical program are executable to communicate via the FIFO structure to cooperatively perform a specified task.

23. The non-transitory memory medium of claim 22, wherein the program instructions are further computer-executable to perform:
automatically generating at least a portion of data transfer logic in response to said including the first node and in accordance with configuration information for the FIFO structure; and
deploying the at least a portion of data transfer logic to the programmable hardware element to implement data transfer functionality for the FIFO structure.

24. The non-transitory memory medium of claim 23,
wherein the FIFO structure is a Direct Memory Access (DMA) FIFO; and
wherein the data transfer logic comprises DMA logic.

25. The non-transitory memory medium of claim 24, wherein the DMA logic comprises at least a portion of a DMA controller.

26. The non-transitory memory medium of claim 22, wherein data are transferred between the first and second graphical programs via program instructions executed by the controller.

27. The non-transitory memory medium of claim 26, wherein the data are transferred between the first and second graphical programs via program instructions executed by the controller using one or more of:
programmed I/O; or
interrupt-driven I/O.

28. The non-transitory memory medium of claim 22, wherein said deploying the first graphical program to the programmable hardware element comprises:
generating a hardware configuration program based on the first graphical program; and
deploying the hardware configuration program on the programmable hardware element.

29. A system for communicating between programs executing respectively on a controller and a programmable hardware element, the system comprising:
a first node representing a FIFO structure, wherein a first portion of the FIFO structure is operable to be implemented on the programmable hardware element, wherein a second portion of the FIFO structure is operable to be implemented in memory of the controller, wherein the first node is operable to be included in a first graphical program comprising a first plurality of interconnected nodes that visually indicate functionality of the first graphical program; and
a second node operable to provide a controller interface to the FIFO structure, wherein the second node is operable to be included in a second graphical program comprising a second plurality of interconnected nodes that visually indicate functionality of the second graphical program;

wherein the first graphical program, including the first node, is deployable to the programmable hardware element, wherein the second graphical program, including the second node, is deployable to the controller, and wherein the first and the second graphical program are executable to communicate via the FIFO structure to cooperatively perform a specified task.

30. The system of claim 29, wherein the first node is configurable to specify one or more of:
  depth of the FIFO structure;
  direction of the FIFO structure, comprising one of:
    controller memory to programmable hardware element; and
    programmable hardware element to controller memory; and
  data type of the FIFO structure.

31. The system of claim 30, wherein the depth of the FIFO structure comprises:
  a hardware depth, comprising a depth of the first portion of the FIFO structure;
  a memory depth, comprising a depth of the second portion of the FIFO structure; and
  wherein the depth comprises the sum of the hardware depth and the memory depth.

32. The system of claim 29,
  wherein the FIFO structure comprises a front, from which data may be read, and a rear, to which data may be written; and
  wherein, if the direction of the FIFO structure is configured to be memory to programmable hardware element, the first portion of the FIFO structure includes the front of the FIFO structure and the second portion of the FIFO structure includes the rear of the FIFO structure, and if the direction of the FIFO structure is configured to be programmable hardware element to memory, the first portion of the FIFO structure includes the rear of the FIFO structure and the second portion of the FIFO structure includes the front of the FIFO structure.

33. The system of claim 29, wherein the second node is configurable to specify a desired function of the FIFO structure, wherein the desired function of the FIFO structure comprises one or more of:
  read operations;
  write operations;
  start operations;
  stop operations; and
  configure operations.

34. The system of claim 33, further comprising:
  a computer system, comprising:
    a processor; and
    memory, coupled to the processor, wherein the memory stores program instructions;
  wherein, to specify a desired function of the FIFO structure, the program instructions are executable by the processor to:
    provide one or more selectable options for specifying the desired function of the FIFO structure; and
    receive input selecting one of the one or more selectable options to specify the desired function of the FIFO structure;
  wherein, after said selecting, the second node is executable to invoke the desired function of the FIFO structure.

35. The system of claim 34, further comprising:
  the controller, comprising:
    a processor; and
    the memory, coupled to the processor; and
  the programmable hardware element, coupled to the controller.

36. The system of claim 35, wherein the FIFO structure is a Direct Access Memory (DMA) FIFO, the system further comprising:
  a DMA controller comprised on or coupled to the programmable hardware element, wherein the DMA controller is operable to receive instructions from the first node and the second node and directly transfer data between the programmable hardware element and the memory of the controller system in accordance with the received instructions.

37. The system of claim 36, wherein the DMA controller comprises:
  first DMA logic, coupled to or comprised on the programmable hardware element, wherein the first DMA logic implements DMA functionality; and
  second DMA logic, comprised on the programmable hardware element, wherein the second DMA logic implements structure functionality for the first DMA logic.

38. The system of claim 37, wherein the program instructions stored in the memory of the computer system are further executable by the processor of the computer system to:
  automatically generate the second DMA logic in response to inclusion of the first node in the first graphical program and in accordance with configuration information for the DMA structure, wherein the second DMA logic is deployable with the first graphical program to the programmable hardware element.

39. The system of claim 38, wherein the program instructions stored in the memory of the computer system are further executable by the processor of the computer system to:
  deploy the first graphical program and the second DMA logic onto the programmable hardware element; and
  deploy the second graphical program to the controller.

40. The system of claim 39,
  wherein the programmable hardware element is operable to execute the first graphical program and the second DMA logic; and
  wherein the controller is operable to execute the second graphical program concurrently with execution of the first graphical program on the programmable hardware element to cooperatively perform the specified task.

41. The system of claim 35, wherein the computer system comprises the controller.

42. The system of claim 29, wherein data are transferred between the first and second graphical programs via program instructions executed by the processor of the computer system.

43. The method of claim 42, wherein the data are transferred between the first and second graphical programs via program instructions executed by the processor of the computer system using one or more of:
  programmed I/O; or
  interrupt-driven I/O.

* * * * *